(12) United States Patent
Okabe et al.

(10) Patent No.: US 11,889,728 B2
(45) Date of Patent: Jan. 30, 2024

(54) DISPLAY DEVICE

(71) Applicant: SHARP KABUSHIKI KAISHA, Sakai (JP)

(72) Inventors: Tohru Okabe, Sakai (JP); Ryosuke Gunji, Sakai (JP); Shinji Ichikawa, Sakai (JP); Shinsuke Saida, Sakai (JP); Shoji Okazaki, Sakai (JP); Tokuo Yoshida, Sakai (JP); Hiroki Taniyama, Sakai (JP); Kohji Ariga, Sakai (JP); Hiroharu Jinmura, Yonago (JP); Akira Inoue, Yonago (JP); Yoshihiro Nakada, Yonago (JP); Yoshihiro Kohara, Yonago (JP); Koji Tanimura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 557 days.

(21) Appl. No.: 17/266,089

(22) PCT Filed: Aug. 28, 2018

(86) PCT No.: PCT/JP2018/031783
§ 371 (c)(1),
(2) Date: Feb. 4, 2021

(87) PCT Pub. No.: WO2020/044439
PCT Pub. Date: Mar. 5, 2020

(65) Prior Publication Data
US 2021/0313412 A1 Oct. 7, 2021

(51) Int. Cl.
*H10K 59/131* (2023.01)
*H10K 50/00* (2023.01)
(Continued)

(52) U.S. Cl.
CPC .......... *H10K 59/131* (2023.02); *H10K 50/00* (2023.02); *H10K 59/124* (2023.02);
(Continued)

(58) Field of Classification Search
CPC ............... H10K 59/131; H10K 59/124; H10K 59/1315; H10K 77/111; H10K 50/00; H10K 2102/311
See application file for complete search history.

(56) References Cited

U.S. PATENT DOCUMENTS 5,161,009 A 11/1992 Tanoi et al.
2006/0043360 A1* 3/2006 Kim ..................... H10K 59/124
257/40

(Continued)

FOREIGN PATENT DOCUMENTS

JP   H04348049 A    12/1992
JP   2014-232300 A  12/2014
WO   2018/135127 A1  7/2018

*Primary Examiner* — Mohsen Ahmadi
(74) *Attorney, Agent, or Firm* — ScienBiziP, P.C.

(57) ABSTRACT

A display device includes: a resin substrate; a TFT layer; and a light-emitting element. A bending portion is provided with a first resin film formed of the same material and in the same layer as those of a first flattening film, and the first resin film fills a slit. An upper face of the first resin film is provided with a plurality of first connection wiring lines formed of a third metal film, and the plurality of first connection wiring lines extend in parallel to each other in a direction intersecting the extending direction of the bending portion. The plurality of first connection wiring lines are electrically connected to a plurality of first lead-out wiring lines, respectively in a display region side of the slit, and electrically connected to a plurality of second lead-out wiring lines, respectively in a terminal portion side of the slit.

13 Claims, 22 Drawing Sheets

(51) Int. Cl.
    *H10K 59/124*     (2023.01)
    *H10K 77/10*     (2023.01)
    *H10K 102/00*     (2023.01)

(52) U.S. Cl.
    CPC ....... *H10K 59/1315* (2023.02); *H10K 77/111* (2023.02); *H10K 2102/311* (2023.02)

(56) References Cited

U.S. PATENT DOCUMENTS

| | | | |
|---|---|---|---|
| 2008/0121886 A1* | 5/2008 | Shin | H10K 50/818 |
| | | | 257/E29.147 |
| 2012/0168755 A1* | 7/2012 | Choi | H10K 50/816 |
| | | | 257/E29.139 |
| 2012/0205674 A1* | 8/2012 | Lee | C09K 11/77342 |
| | | | 257/E33.056 |
| 2014/0353670 A1 | 12/2014 | Youn et al. | |
| 2015/0287675 A1* | 10/2015 | Shaviv | H01L 21/7685 |
| | | | 438/618 |
| 2015/0287750 A1 | 10/2015 | Youn et al. | |
| 2015/0371573 A1* | 12/2015 | Choi | H10K 50/8428 |
| | | | 345/206 |
| 2016/0233251 A1* | 8/2016 | Sasaki | H01L 29/66742 |
| 2016/0306460 A1* | 10/2016 | Lee | G06F 3/044 |
| 2017/0069873 A1* | 3/2017 | Kim | H10K 59/88 |
| 2018/0247993 A1* | 8/2018 | Fujioka | H10K 59/131 |
| 2018/0337224 A1* | 11/2018 | Aoki | H10K 59/131 |
| 2019/0096975 A1* | 3/2019 | Park | H10K 59/131 |
| 2019/0341442 A1 | 11/2019 | Kajiyama et al. | |
| 2021/0210586 A1 | 7/2021 | Kajiyama et al. | |
| 2021/0407895 A1* | 12/2021 | Lin | H05K 3/0094 |

\* cited by examiner

DISPLAY DEVICE

TECHNICAL FIELD

The disclosure relates to a display device.

BACKGROUND ART

In recent years, a self-luminous organic electroluminescent (EL) display device using an organic EL element has attracted attention as a display device that can replace a liquid crystal display device. In this organic EL display device, a flexible organic EL display device in which an organic EL element or the like is formed on a resin substrate having flexibility is proposed. Here, in the organic EL display device, a display region that displays an image and a frame region in a periphery of the display region are provided, and reduction of the frame region is demanded. Then, in the flexible organic EL display device, when the frame region is bent to reduce the area occupied by the frame region in a plane view, a wiring line disposed in the frame region may break.

For example, PTL 1 discloses a flexible display device in which a bending hole is formed, and accordingly a portion of each of a buffer film, a gate insulating film, and an interlayer insulating film corresponding to a bending region is removed and disconnection of a wiring line is prevented.

CITATION LIST

Patent Literature

PTL 1: JP 2014-232300 A

SUMMARY

Technical Problem

Now, in a flexible organic EL display device, an inorganic insulating film such as a base coat film, a gate insulating film, and an interlayer insulating film is provided on a resin substrate and thus, to suppress disconnection of a wiring line in a frame region, the inorganic insulating film at a bending portion of the frame region is removed, a flattening film is formed in a portion where the inorganic insulating film is removed, and a wiring line is formed on the flattening film. However, in the organic EL display device including such a configuration, it is necessary to separately form the flattening film only in the portion where the inorganic insulating film is removed in the bending portion of the frame region, and thus a manufacturing cost increases. There is room for improvement.

The disclosure has been made in view of the above, and an object of the disclosure is to suppress disconnection of a wiring line in a bending portion of a frame region at a low cost.

Solution to Problem

To achieve the above-described object, a display device according to the disclosure includes a resin substrate configured to define a display region configured to display an image, a frame region in a periphery of the display region, a terminal portion at an end portion of the frame region, and a bending portion extending in one direction between the terminal portion and the display region, a TFT layer provided on the resin substrate and including a first metal film, a first inorganic insulating film, a second metal film, a first flattening film, a third metal film, and a second flattening film sequentially layered, and a light-emitting element provided on the TFT layer and including a plurality of pixel electrodes disposed on the second flattening film and an edge cover configured to cover a peripheral end portion of each of the plurality of pixel electrodes. The first inorganic insulating film is provided with a slit in the bending portion, and the slit opens upward and extends in an extending direction of the bending portion. The display region side and the terminal portion side of the slit are provided with a plurality of first lead-out wiring lines and a plurality of second lead-out wiring lines formed of the first metal film, respectively, and the plurality of first lead-out wiring lines and the plurality of second lead-out wiring lines extend in parallel to each other in a direction intersecting the extending direction of the bending portion. The display region is provided with a plurality of first display wiring lines formed of the second metal film, the first flattening film covering each of the plurality of first display wiring lines, a plurality of second display wiring lines formed of the third metal film on the first flattening film, and the second flattening film covering each of the plurality of second display wiring lines. The bending portion is provided with a first resin film formed of the same material and in the same layer as those of the first flattening film, and the first resin film fills the slit. An upper face of the first resin film is provided with a plurality of first connection wiring lines formed of the third metal film, and the plurality of first connection wiring lines extend in parallel to each other in a direction intersecting the extending direction of the bending portion. The plurality of first connection wiring lines are electrically connected to the plurality of first lead-out wiring lines, respectively in the display region side of the slit, and electrically connected to the plurality of second lead-out wiring lines, respectively in the terminal portion side of the slit.

Advantageous Effects of Disclosure

According to the disclosure, a display region is provided with a plurality of first display wiring lines formed of a second metal film, a first flattening film covering each of the plurality of first display wiring lines, and a plurality of second display wiring lines formed of a third metal film on the first flattening film. A bending portion is provided with a first resin film formed of the same material and in the same layer as those of the first flattening film and the first resin film fills a slit of a first inorganic insulating film. An upper face of the first resin film is provided with a plurality of first connection wiring lines formed of the third metal film, and the plurality of first connection wiring lines extend in parallel to each other in a direction intersecting an extending direction of the bending portion. Thus, disconnection of a wiring line in the bending portion of the frame region can be suppressed at a low cost.

DESCRIPTION OF EMBODIMENTS

Embodiments of the disclosure will be described below in detail with reference to the drawings. Note that the disclosure is not limited to each embodiment described below.

First Embodiment

Figure 1:
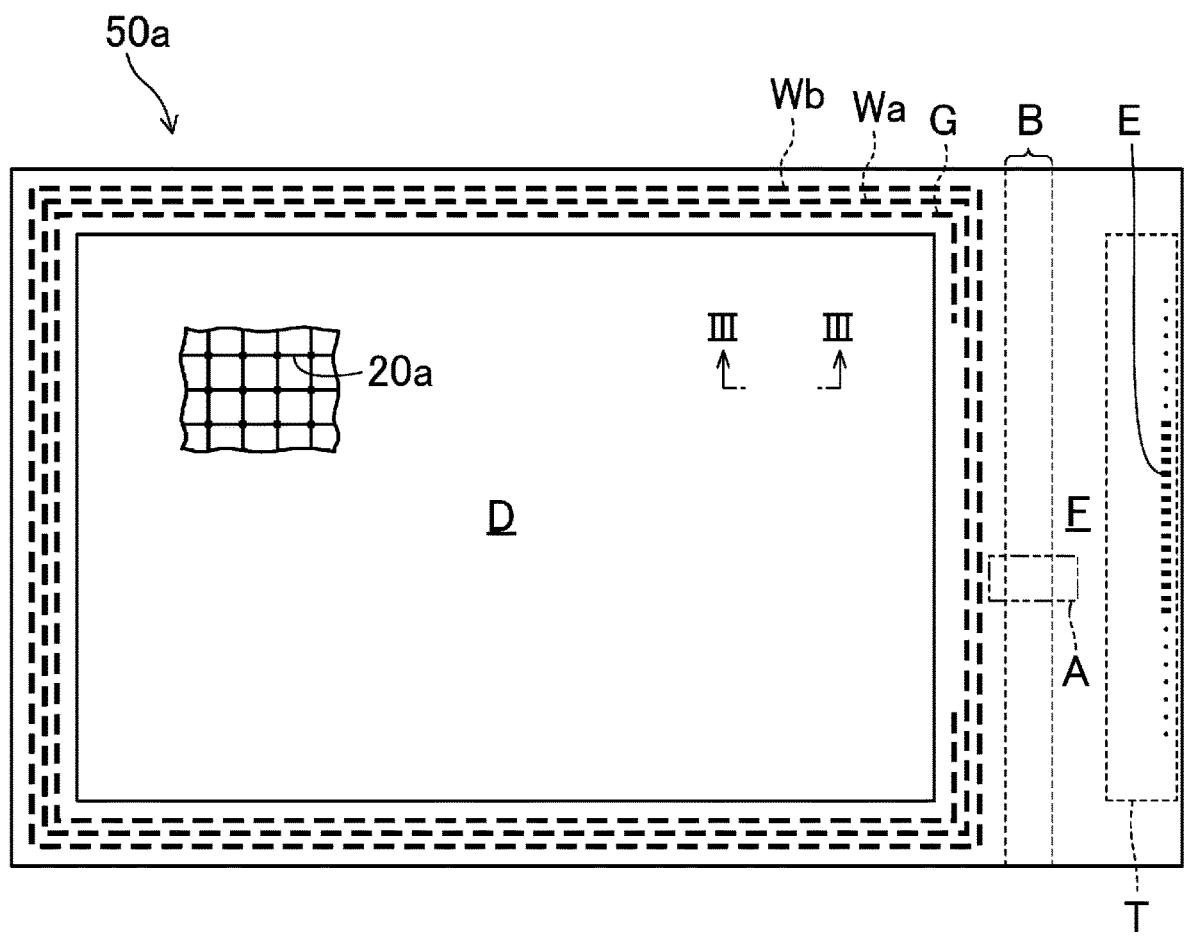
FIG. 1 is a plan view illustrating a schematic configuration of an organic EL display device according to a first embodiment of the disclosure.
Figure 2:
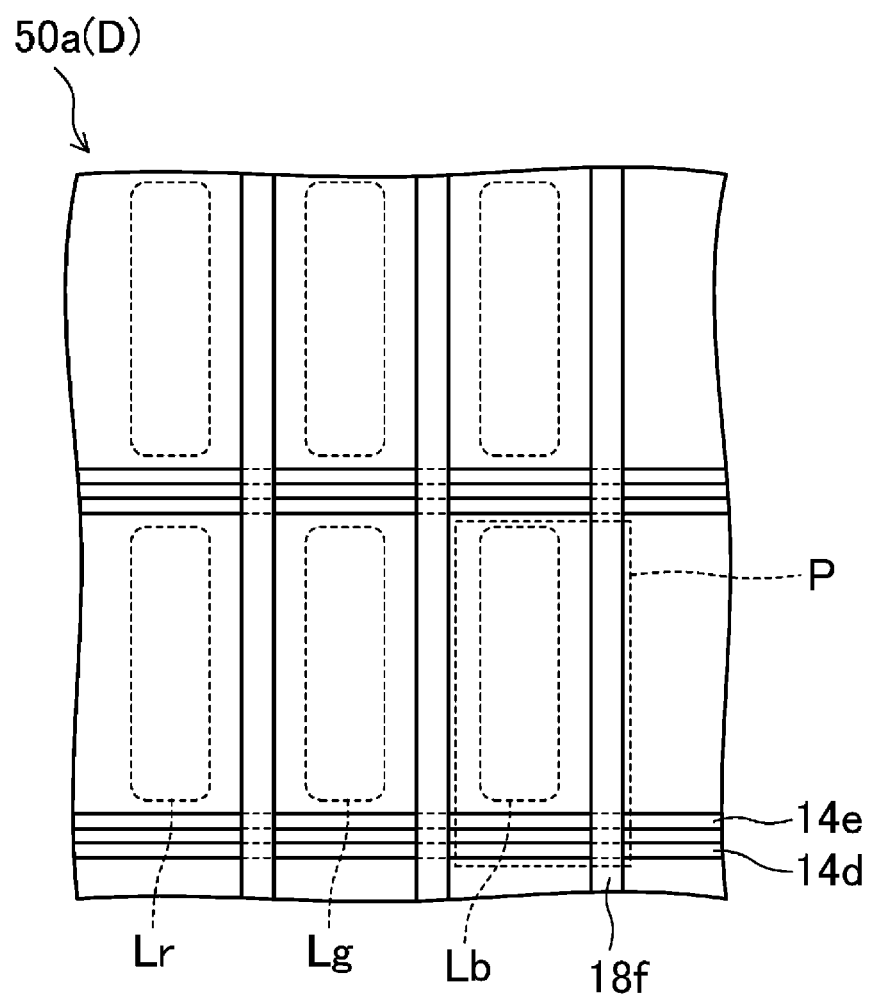
FIG. 2 is a plan view of a display region of the organic EL display device according to the first embodiment of the disclosure.
Figure 3:
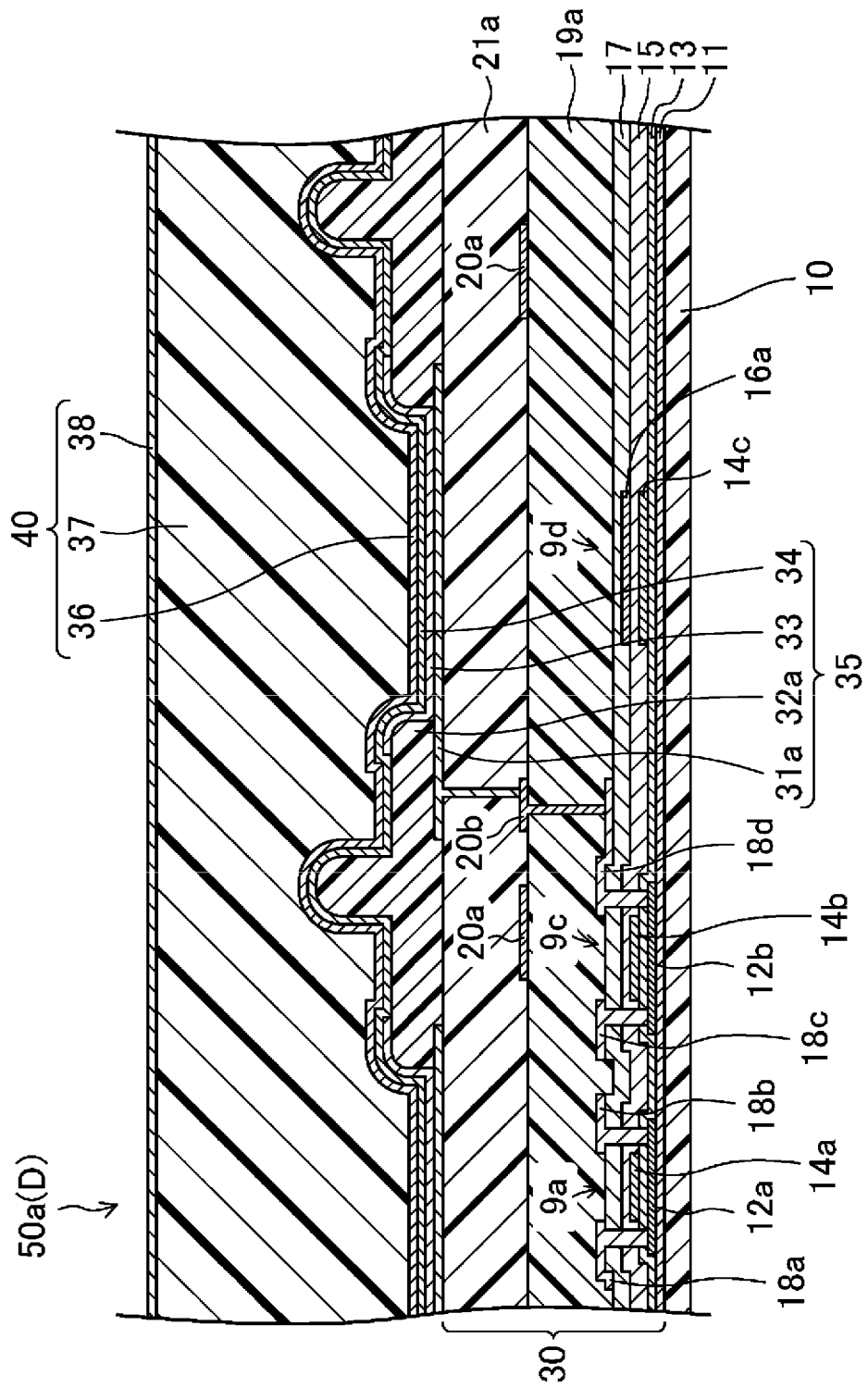
FIG. 3 is a cross-sectional view of the display region of the organic EL display device taken along line in FIG. 1.
Figure 4:
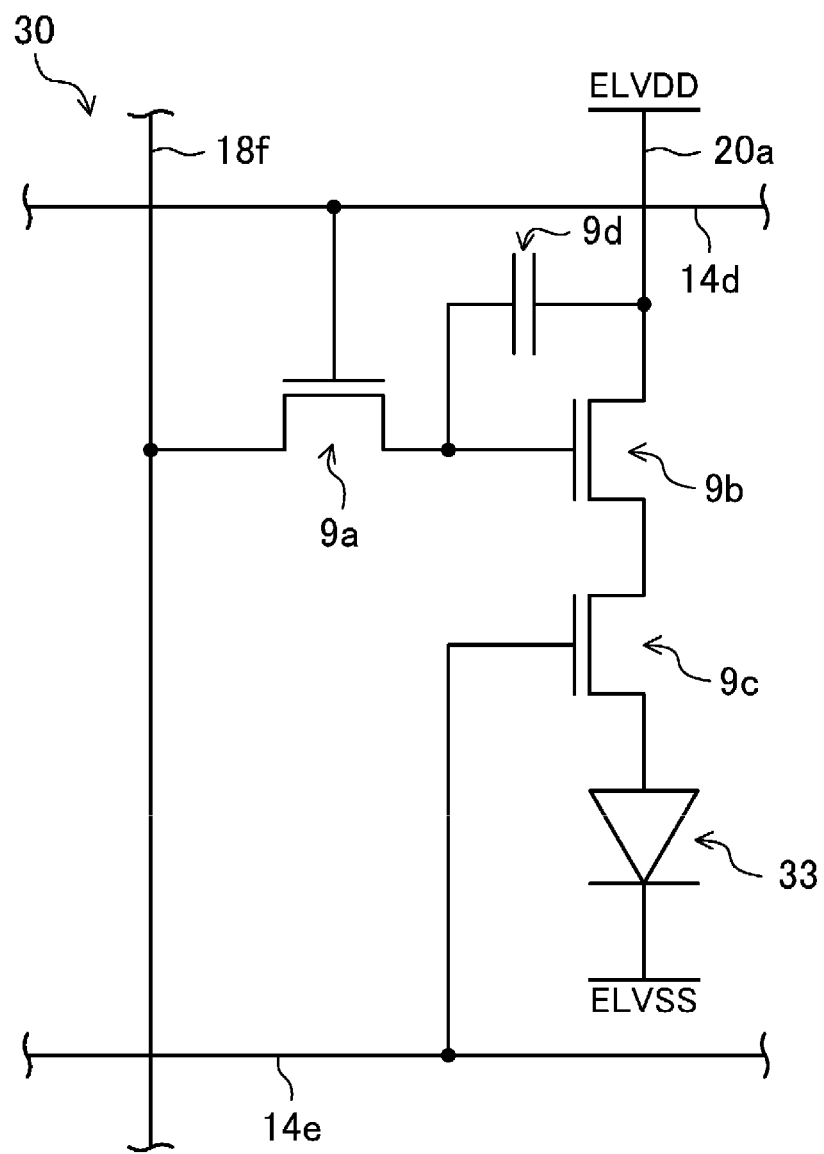
FIG. 4 is an equivalent circuit diagram of a TFT layer constituting the organic EL display device according to the first embodiment of the disclosure.
Figure 5:
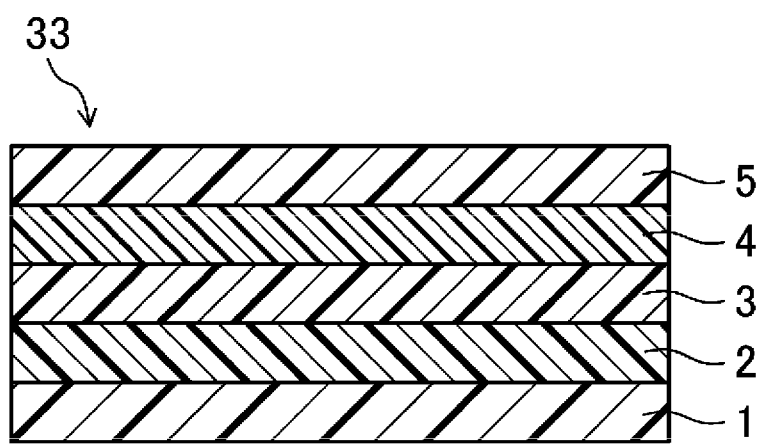
FIG. 5 is a cross-sectional view illustrating an organic EL layer constituting the organic EL display device according to the first embodiment of the disclosure.
Figure 6:
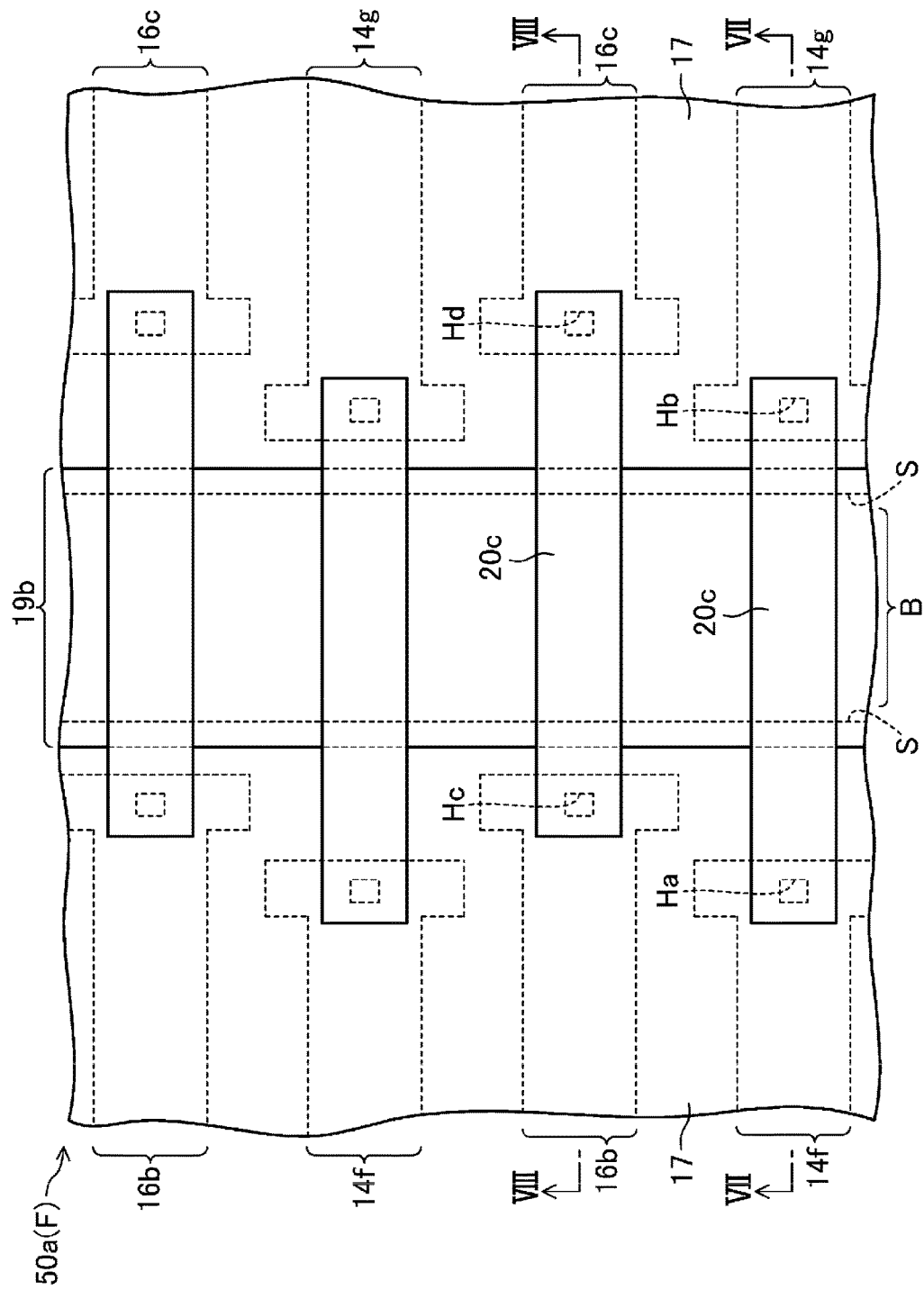
FIG. 6 is a plan view of a frame region including a bending portion of the organic EL display device in an enlarged view of a region A in FIG. 1.
Figure 7:
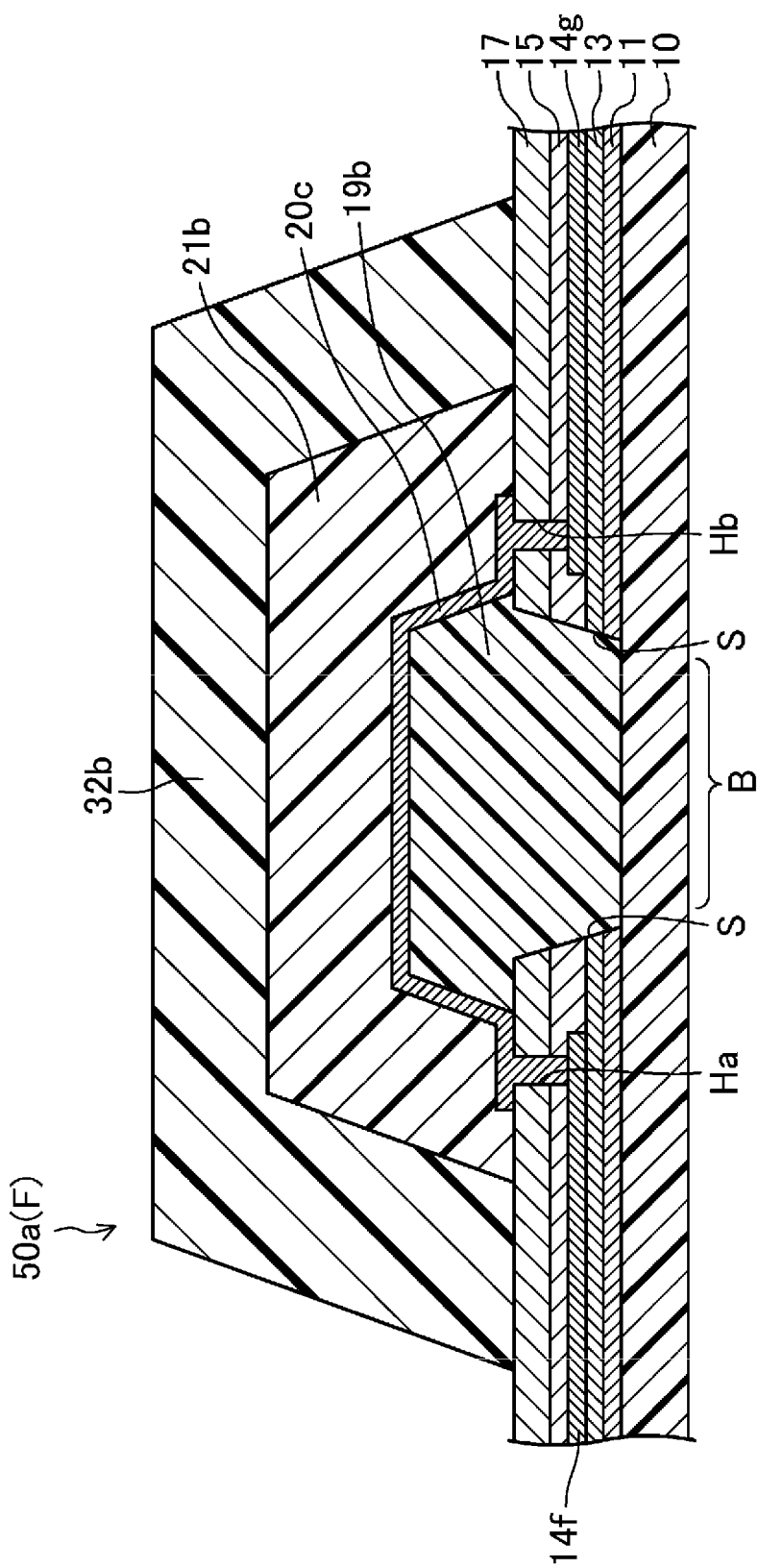
FIG. 7 is a cross-sectional view of the frame region including the bending portion of the organic EL display device taken along line VII-VII in FIG. 6.
Figure 8:
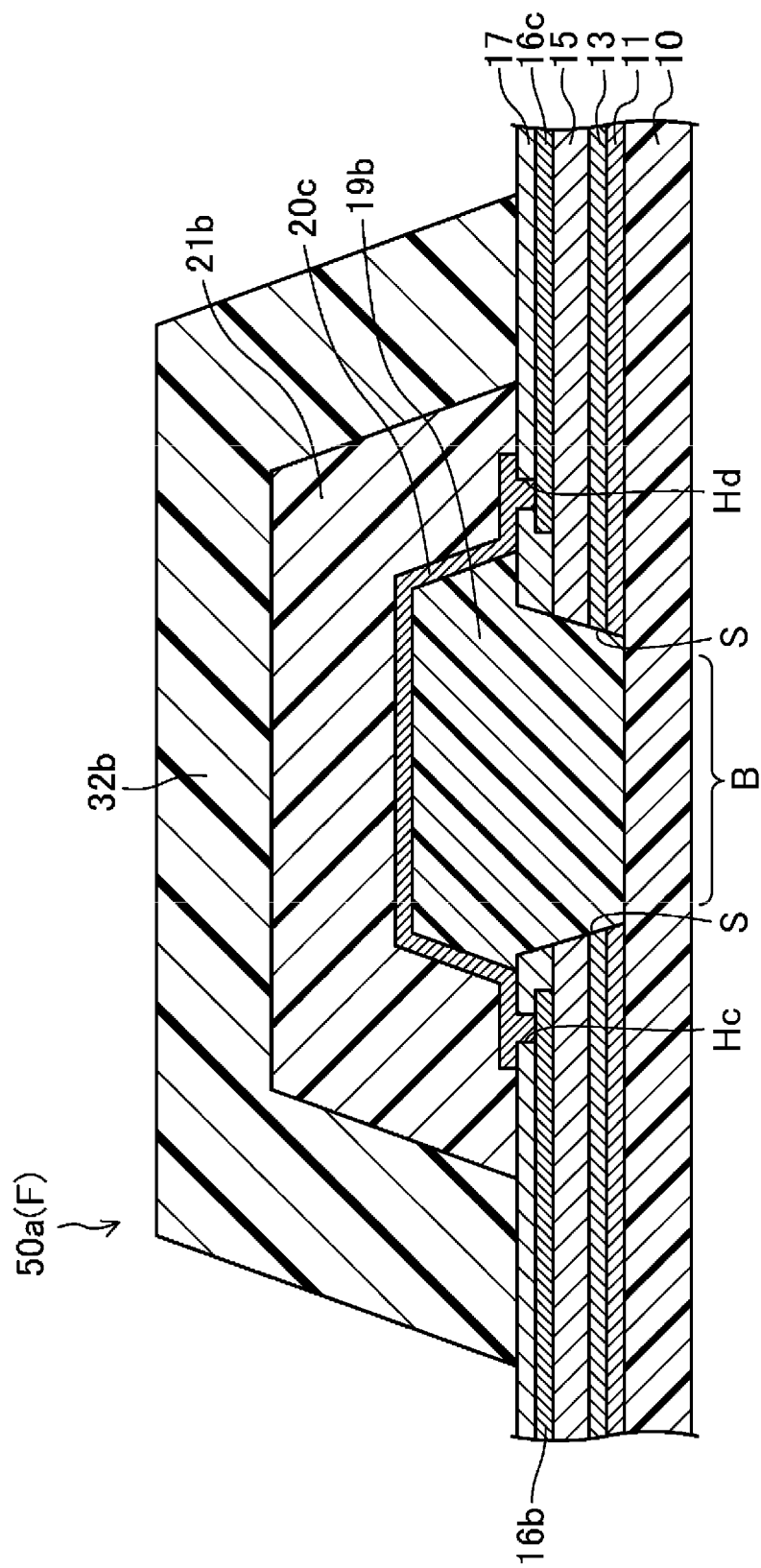
FIG. 8 is a cross-sectional view of the frame region including the bending portion of the organic EL display device taken along line VIII-VIII in FIG. 6.

FIG. 1 to FIG. 8 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. Additionally, FIG. 2 is a plan view of a display region D of the organic EL display device Additionally, FIG. 3 is a cross-sectional view of the display region D of the organic EL display device 50a taken along line in FIG. 1. Additionally, FIG. 4 is an equivalent circuit diagram of a thin film transistor (TFT) layer 30 constituting the organic EL display device 50a. Additionally, FIG. 5 is a cross-sectional view illustrating an organic EL layer 33 constituting the organic EL display device 50a. Additionally, FIG. 6 is a plan view of a frame region F including a bending portion B of the organic EL display device 50a in an enlarged view of a region A in FIG. 1. Additionally, FIG. 7 and FIG. 8 are cross-sectional views of the frame region F including the bending portion B of the organic EL display device 50a taken along line VII-VII and line VIII-VIII in FIG. 6. Note that, in the plan view of FIG. 6, a second resin film 21b and a third resin film 32b described below are omitted.

As illustrated in FIG. 1, the organic EL display device 50a includes, for example, the display region D provided in a rectangular shape and configured to display an image, and the frame region F provided in a periphery of the display region D.

In the display region D, as illustrated in FIG. 2, a plurality of subpixels P are arrayed in a matrix shape. Additionally, as illustrated in FIG. 2, in the display region D, for example, a subpixel P including a red light-emitting region Lr configured to perform red display, a subpixel P including a green light-emitting region Lg configured to perform green display, and a subpixel P including a blue light-emitting region Lb configured to perform blue display are provided adjacent to each other. Note that in the display region D, for example, the three subpixels P adjacent to each other including the red light-emitting region Lr, the green light-emitting region Lg, and the blue light-emitting region Lb constitute one pixel.

A terminal portion T including a plurality of terminals E is provided at a right end portion of the frame region F in FIG. 1. Additionally, as illustrated in FIG. 1, in the frame region F, the bending portion B bendable, for example, by 180 degrees (in a U-shape) about a bending axis that is the vertical direction in the figure is provided between the display region D and the terminal portion T, and extends in one direction (the vertical direction in the figure). Additionally, as illustrated in FIG. 1, in the frame region F, a first flattening film 19a and a second flattening film 21a, described below are provided with a trench G having a substantially C shape and passing through the first flattening film 19a and the second flattening film 21a. Here, as illustrated in FIG. 1, the trench G is provided in a substantially C shape and the terminal portion T side opens in a plane view.

As illustrated in FIG. 3, the organic EL display device 50a includes a resin substrate layer 10 provided as a resin substrate, a TFT layer 30 provided on the resin substrate layer 10, an organic EL element 35 provided as a light-emitting element on the TFT layer and a sealing film 40 provided covering the organic EL element 35.

As illustrated in FIG. 3, the TFT layer 30 includes a base coat film 11 provided on the resin substrate layer 10, a plurality of first TFTs 9a, a plurality of second TFTs 9b (see FIG. 4), a plurality of third TFTs 9c, and a plurality of capacitors 9d provided on the base coat film 11, and the first flattening film 19a and the second flattening film 21a sequentially provided on each of the first TFTs 9a, each of the second TFTs 9b, each of the third TFTs 9c, and each of the capacitors 9d.

As illustrated in FIG. 3, in the TFT layer 30, the base coat film 11, a semiconductor film, a gate insulating film 13, a first metal film, a first interlayer insulating film 15 (first inorganic insulating film), a fourth metal film, a second interlayer insulating film 17 (second inorganic insulating film), a second metal film, the first flattening film 19a, a third metal film, and the second flattening film 21a are sequentially layered on the resin substrate layer 10. Here, the semiconductor film described above constitutes a first semiconductor layer 12a and the like described below, the first metal film described above constitutes a gate line 14d and the like described below, the fourth metal film described above constitutes an upper conductive layer 16a and the like described below, the second metal film described above constitutes a source line 18f and the like described below, and the third metal film described above constitutes a power source line 20a and the like described below. Additionally, the second metal film and the third metal film described above are formed of, for example, a metal layered film of a titanium film, an aluminum film, a titanium film, and the like, and the first metal film and the fourth metal film described above are formed of, for example, a molybdenum film. Note that, in a case where the fourth metal film described above is omitted, the first interlayer insulating film 15 and the second interlayer insulating film 17 are provided as the first inorganic insulating film.

As illustrated in FIG. 2 and FIG. 4, in the TFT layer 30, in the display region D, a plurality of the gate lines 14d are provided as a plurality of display wiring lines, and extend in parallel to each other in the horizontal direction in the figures. Additionally, as illustrated in FIG. 2 and FIG. 4, in the TFT layer 30, in the display region D, a plurality of light emission control lines 14e are provided as a plurality of display wiring lines, and extend in parallel to each other in the horizontal direction in the figures. Note that, as illustrated in FIG. 2, each of the light emission control lines 14e is provided adjacent to each of the gate lines 14d. Additionally, as illustrated in FIG. 2 and FIG. 4, in the TFT layer 30, in the display region D, a plurality of the source lines 18f are provided as a plurality of display wiring lines, and extend in parallel to each other in the vertical direction in the figures. Additionally, in the TFT layer 30, in the display region D, a power source line 20a including a plurality of power source lines (20a) extending in parallel to each other in the vertical direction in FIG. 1 and a plurality of power source lines (20a) extending in parallel to each other in the horizontal direction in FIG. 1 coupled at each intersecting portion is provided in a lattice pattern as a plurality of display wiring lines. Additionally, as illustrated in FIG. 4, in the TFT layer 30, in each subpixel P, the first TFT 9a, the second TFT 9b, the third TFT 9c, and the capacitor 9d are provided.

The base coat film 11 includes a single-layer film or a layered film of an inorganic insulating film of, for example, silicon nitride, silicon oxide, or silicon oxynitride.

As illustrated in FIG. 4, the first TFT 9a is electrically connected to the corresponding gate line 14d, the corresponding source line 18f, and the corresponding second TFT 9b in each subpixel P. Additionally, as illustrated in FIG. 3, the first TFT 9a includes the semiconductor layer 12a, the gate insulating film 13, a gate electrode 14a, the first interlayer insulating film 15, the second interlayer insulating film 17, and a source electrode 18a and a drain electrode 18b that are sequentially provided on the base coat film 11. Here, as illustrated in FIG. 3, the semiconductor layer 12a is provided in an island shape on the base coat film 11, and includes a channel region, a source region, and a drain region, as described below. Additionally, as illustrated in FIG. 3, the gate insulating film 13 is provided covering the semiconductor layer 12a. Additionally, as illustrated in FIG. 3, the gate electrode 14a is provided on the gate insulating film 13, and overlaps the channel region of the semiconductor layer 12a. Additionally, as illustrated in FIG. 3, the first interlayer insulating film 15 and the second interlayer insulating film 17 are sequentially provided covering the gate electrode 14a. Additionally, as illustrated in FIG. 3, the source electrode 18a and the drain electrode 18b are provided being separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that the gate insulating film 13, the first interlayer insulating film 15, and the second interlayer insulating film 17 includes a single-layer film or a layered film of an inorganic insulating film of, for example, silicon nitride, silicon oxide, or silicon oxynitride.

As illustrated in FIG. 4, the second TFT 9b is electrically connected to the corresponding first TFT 9a, the corresponding power source line 20a, and the corresponding third TFT 9c in each subpixel P. Note that the second TFT 9b includes substantially the same structure as the structures of the first TFT 9a and the third TFT 9c.

As illustrated in FIG. 4, the third TFT 9c is electrically connected to the corresponding second TFT 9a, the corresponding power source line 20a, and the corresponding light emission control line 14e in each subpixel P. Additionally, as illustrated in FIG. 3, the third TFT 9c includes a semiconductor layer 12b, the gate insulating film 13, a gate electrode 14b, the first interlayer insulating film 15, the second interlayer insulating film 17, and a source electrode 18c and a drain electrode 18d that are sequentially provided on the base coat film 11. Here, as illustrated in FIG. 3, the semiconductor layer 12b is provided in an island shape on the base coat film 11, and includes a channel region, a source region, and a drain region, as with the semiconductor layer 12a. Additionally, as illustrated in FIG. 3, the gate insulating film 13 is provided covering the semiconductor layer 12b. Additionally, as illustrated in FIG. 3, the gate electrode 14b is provided on the gate insulating film 13, and overlaps the channel region of the semiconductor layer 12b. Additionally, as illustrated in FIG. 3, the first interlayer insulating film 15 and the second interlayer insulating film 17 are sequentially provided covering the gate electrode 14b. Additionally, as illustrated in FIG. 3, the source electrode 18c and the drain electrode 18d are provided being separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that, in the present embodiment, the first TFT 9a, the second TFT 9b, and the third TFT 9c of a top gate type are exemplified, but the first TFT 9a, the second TFT 9b, and the third TFT 9c may be of a bottom gate type.

As illustrated in FIG. 4, the capacitor 9d is electrically connected to the corresponding first TFT 9a and the corresponding power source line 20a in each subpixel P. Here, the capacitor 9d includes, as illustrated in FIG. 3, a lower conductive layer 14c formed in the same layer and of the same material as those of the gate electrode 14a and the like, the first interlayer insulating film 15 provided covering the lower conductive layer 14c, and the upper conductive layer 16a provided on the first interlayer insulating film 15 and overlapping the lower conductive layer 14c. Note that the upper conductive layer 16a is electrically connected to the power source line 20a via a contact hole (not illustrated) formed in the second interlayer insulating film 17 and the first flattening film 19a.

The first flattening film 19a is provided covering each of the source lines 18f, and includes, for example, an organic resin material such as a polyimide resin. Note that, in the present embodiment, the first flattening film 19a made of a polyimide resin is exemplified, but the first flattening film 19a may include an organic resin material such as an acrylic resin and a polysiloxane resin.

The second flattening film 21a is provided covering the power source line 20a, and includes, for example, an organic resin material such as a polyimide resin. Note that, in the present embodiment, the second flattening film 21a made of a polyimide resin is exemplified, but the second flattening film 21a may include an organic resin material such as an acrylic resin and a polysiloxane resin.

The organic EL element 35 includes, as illustrated in FIG. 3, a plurality of first electrodes 31a, an edge cover 32a, a plurality of the organic EL layers 33, and a second electrode 34 that are provided sequentially on the TFT layer 30.

As illustrated in FIG. 3, the plurality of first electrodes 31a are provided in a matrix shape as pixel electrodes on the second flattening film 21a and correspond to the plurality of subpixels P. Here, as illustrated in FIG. 3, each of the first electrodes 31a is electrically connected to the drain electrode 18d of each of the third TFTs 9c via a contact hole formed in the first flattening film 19a, a contact layer 20b formed of the third metal film described above, and a contact hole formed in the second flattening film 21a. Additionally, the first electrode 31a has a function to inject a hole (positive hole) into each of the organic EL layers 33. Additionally, the first electrode 31a is preferably formed of a material having a large work function to improve hole injection efficiency into the organic EL layer 33. Here, examples of a material constituting the first electrode 31a include a metallic material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Additionally, the material constituting the first electrode 31a may be, for example, an alloy such as astatine (At)/astatine oxide (AtO$_2$). Further, the material constituting the first electrode 31a may be, for example, an electrically conductive oxide such as tin oxide (SnO), zinc oxide (ZnO), indium tin oxide (ITO), and indium zinc oxide (IZO). Additionally, the first electrode 31a may be formed by layering a plurality of layers including any of the materials described above. Note that, examples of a compound material having a large work function include indium tin oxide (ITO) and indium zinc oxide (IZO).

As illustrated in FIG. 3, the edge cover 32a is provided in a lattice pattern, and covers a peripheral end portion of each of the first electrodes 31a. Here, examples of a material constituting the edge cover 32a include an organic film of a polyimide resin, an acrylic resin, and a polysiloxane resin.

As illustrated in FIG. 3, the plurality of organic EL layers 33 are disposed on each of the first electrodes 31a, and provided in a matrix shape and correspond to the plurality of subpixels P. Here, as illustrated in FIG. 5, each of the organic EL layers 33 includes a hole injection layer 1, a hole transport layer 2, a light-emitting layer 3, an electron transport layer 4, and an electron injection layer 5 that are provided sequentially on the first electrode 31a.

The hole injection layer 1 is also referred to as an anode electrode buffer layer, and has a function to reduce an energy level difference between the first electrode 31a and the organic EL layer 33 and to improve hole injection efficiency from the first electrode 31a into the organic EL layer 33. Here, examples of a material constituting the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has a function to improve hole transport efficiency from the first electrode 31a to the organic EL layer 33. Here, examples of a material constituting the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where, when a voltage is applied by the first electrode 31a and the second electrode 34, a positive hole and an electron are injected from the first electrode 31a and the second electrode 34, respectively, and the positive hole and the electron are recombined. Here, the light-emitting layer 3 is formed of a material having high luminous efficiency. Then, examples of the material constituting the light-emitting layer 3 include a metal oxinoid compound (8-hydroxyquinoline metal complex), a naphthalene derivative, an anthracene derivative, a diphenyl ethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, and polysilane.

The electron transport layer 4 has a function to efficiently transport an electron to the light-emitting layer 3. Here, examples of a material constituting the electron transport layer 4 include, as an organic compound, an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has a function to reduce an energy level difference between the second electrode 34 and the organic EL layer 33 and to improve electron injection efficiency from the second electrode 34 into the organic EL layer 33, and a drive voltage of the organic EL element 35 can be lowered by this function. Note that the electron injection layer 5 is also referred to as a cathode electrode buffer layer. Here, examples of a material constituting the electron injection layer 5 include an inorganic alkaline compound such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

As illustrated in FIG. 3, the second electrode 34 is provided as a common electrode, and covers each of the organic EL layers 33 and the edge cover 32a. Additionally, the second electrode 34 has a function to inject an electron into the organic EL layer 33. Additionally, the second electrode 34 preferably includes a material having a small work function to improve electron injection efficiency into the organic EL layer 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Additionally, the second electrode 34 may be formed of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Additionally, the second electrode 34 may be formed of, for example, an electrically conductive oxide such as tin oxide (SnO), zinc oxide (ZnO), indium tin oxide (ITO), and indium zinc oxide (IZO). Additionally, the second electrode 34 may be formed by layering a plurality of layers including any of the materials described above. Note that examples of the material having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 40 is provided covering the second electrode 34, and includes a first inorganic film 36, an organic film 37, and a second inorganic film 38 sequentially layered on the second electrode 34, and has a function to protect the organic EL layer 33 of the organic EL element 35 from moisture and oxygen. Here, the first inorganic film 36 and the second inorganic film 38 include, for example, an inorganic insulating film such as a silicon nitride film, a silicon oxide film, and a silicon oxynitride film. Additionally, the organic film 37 includes, for example, an organic resin material such as an acrylic resin, an epoxy resin, a silicone resin, a polyurea resin, a parylene resin, a polyimide resin, and a polyamide resin.

Additionally, as illustrated in FIG. 1, the organic EL display device 50a includes, in the frame region F, a first dam wall Wa provided in a frame shape outside the trench G and a second dam wall Wb provided in a frame shape in a periphery of the first dam wall Wa. Here, the first dam wall Wa and the second dam wall Wb are each formed by, for example, layering a lower layer resin layer formed of the same material and in the same layer as those of the first flattening film 19a, and an upper layer resin layer formed of the same material and in the same layer as those of the edge cover 32a. Note that the first dam wall Wa is provided overlapping a peripheral end portion of the organic film 37 of the sealing film 40, and is configured to suppress the spread of ink of the organic film 37 of the sealing film 40. Additionally, an inside of the trench G is provided with, for example, a frame wiring line (not illustrated) that is formed into a frame shape in a plane view, and that is input a high power supply voltage (ELVDD) at the terminal portion T extended, and is electrically connected to the power source line 20a. Additionally, an outside of the trench G is provided with, for example, another frame wiring line (not illustrated) that is formed into a substantially C shape in a plane view, and that is input a low power supply voltage (ELVSS) at the terminal portion T extended, and is electrically connected to the second electrode 34.

Additionally, as illustrated in FIG. 6 to FIG. 8, the organic EL display device 50a includes, in the bending portion B of the frame region F, a first resin film 19b provided filling a slit S formed in the base coat film 11, the gate insulating film 13, the first interlayer insulating film 15 and the second interlayer insulating film 17, a plurality of first connection wiring lines 20c provided on the first resin film 19b, the second resin film 21b provided covering each of the first connection wiring lines 20c, and the third resin film 32b provided covering the second resin film 21b.

As illustrated in FIG. 7 and FIG. 8, the slit S is provided in a groove shape that penetrates the base coat film 11, the gate insulating film 13, the first interlayer insulating film 15, and the second interlayer insulating film 17, and opens upward, and that passes along the extending direction of the bending portion B and exposes an upper face of the resin substrate layer 10. Note that in the present embodiment, the slit S penetrating the base coat film 11, the gate insulating film 13, the first interlayer insulating film 15, and the second interlayer insulating film 17 is exemplified, but an inorganic insulating film may remain in a base of the slit S without the slit S penetrating the base coat film 11, the gate insulating film 13, the first interlayer insulating film 15, and the second interlayer insulating film 17.

As illustrated in FIG. 6 and FIG. 7, in the display region D side (left side in the figures) of the slit S, a plurality of first lead-out wiring lines 14f formed of the first metal film described above are provided extending in parallel to each other in a direction orthogonal to the extending direction of the bending portion B. Additionally, as illustrated in FIG. 6 and FIG. 8, in the display region D side (left side in the figures) of the slit S, a plurality of third lead-out wiring lines 16b formed of the fourth metal film described above are provided extending in parallel to each other in a direction orthogonal to the extending direction of the bending portion B. Note that, as illustrated in FIG. 6, each of the third lead-out wiring lines 16b is provided adjacent to each of the first lead-out wiring lines 14f. Additionally, the first lead-out wiring lines 14f and the third lead-out wiring lines 16b are electrically connected, via a lead-out wiring line (not illustrated), to a signal wiring line (the gate line 14d, the light emission control line 14e, the source line 18f, the power source line 20a, and the like) extending to the display region D.

As illustrated in FIG. 6 and FIG. 7, in the terminal portion T side (right side in the figures) of the slit S, a plurality of second lead-out wiring lines 14g formed of the first metal film described above are provided extending in parallel to each other in a direction orthogonal to the extending direction of the bending portion B. Additionally, as illustrated in FIG. 6 and FIG. 8, in the terminal portion T side (right side in the figures) of the slit S, a plurality of fourth lead-out wiring lines 16c formed of the fourth metal film described above are provided extending in parallel to each other in a direction orthogonal to the extending direction of the bending portion B. Note that, as illustrated in FIG. 6, each of the fourth lead-out wiring lines 16c is provided adjacent to each of the second lead-out wiring lines 14g. Additionally, the second lead-out wiring lines 14g and the fourth lead-out wiring lines 16c are electrically connected to the terminals E of the terminal portion T via another lead-out wiring line (not illustrated).

The first resin film 19b is formed of the same material and in the same layer as those of the first flattening film 19a.

The plurality of first connection wiring lines 20c are formed of the third metal film described above and, as illustrated in FIG. 6, are provided extending in parallel to each other in a direction orthogonal to the extending direction of the bending portion B, and crossing the first resin film 19b. Here, as illustrated in FIG. 6 and FIG. 7, an end portion in the display region D side (left side in the figures) of one of a pair of the first connection wiring lines 20c adjacent is electrically connected to the first lead-out wiring line 14f via a contact hole Ha formed in the first interlayer insulating film 15 and the second interlayer insulating film 17. Additionally, as illustrated in FIG. 6 and FIG. 8, an end portion in the display region D side (left side in the figures) of the other of the pair of first connection wiring lines 20c adjacent is electrically connected to the third lead-out wiring line 16b via a contact hole He formed in the second interlayer insulating film 17. Further, as illustrated in FIG. 6 and FIG. 7, an end portion in the terminal portion T side (right side in the figures) of one of the pair of first connection wiring lines 20c adjacent is electrically connected to the second lead-out wiring line 14g via a contact hole Hb formed in the first interlayer insulating film 15 and the second interlayer insulating film 17. Additionally, as illustrated in FIG. 6 and FIG. 8, an end portion in the terminal portion T side (right side in the figures) of the other of the pair of first connection wiring lines 20c adjacent is electrically connected to the fourth lead-out wiring line 16c via a contact hole Hd formed in the second interlayer insulating film 17.

The second resin film 21b is formed of the same material and in the same layer as those of the second flattening film 21a.

The third resin film 32b is formed of the same material and in the same layer as those of the edge cover 32a.

In the organic EL display device 50a described above, in each subpixel P, a gate signal is input to the first TFT 9a via the gate line 14d, and accordingly, the first TFT 9a becomes in an on state. A predetermined voltage corresponding to a source signal is written to the gate electrode 14b of the second TFT 9b and the capacitor 9d via the source line 18f, and the third TFT 9c becomes in an on state when a light emission control signal is input to the third TFT 9c through the light emission control line 14e. The light-emitting layer 3 of the organic EL layer 33 emits light when a current corresponding to a gate voltage of the second TFT 9b is supplied from the power source line 20a to the organic EL layer 33, and accordingly, an image is displayed. Note that, in the organic EL display device 50a, even when the first TFT 9a becomes in an off state, the gate voltage of the second TFT 9b is held by the capacitor 9d, and thus light emission by the light-emitting layer 3 is maintained in each subpixel P until a gate signal of the next frame is input.

Next, a manufacturing method for the organic EL display device 50a according to the present embodiment will be described. Note that the manufacturing method for the organic EL display device 50a according to the present embodiment includes a TFT layer forming step, an organic EL element forming step, and a sealing film forming step.

TFT Layer Forming Step

For example, the TFT layer 30 is formed by forming, by using a known method, the base coat film 11, the first TFT 9a, the second TFT 9b, the third TFT 9c, the capacitor 9d, the first flattening film 19a, the power source line 20a, the second flattening film 21a, and the like in a surface of the resin substrate layer 10 formed on a glass substrate.

Here, when the first TFT 9a, the second TFT 9b, and the third TFT 9c are formed in the display region D, before the source line 18f and the like are formed, a layered film of the base coat film 11, the gate insulating film 13, the first interlayer insulating film 15, and the second interlayer insulating film 17 is removed in the bending portion B of the frame region F by dry etching, and the slit S is formed. Subsequently, after the formation of the source line 18f and the like, when the first flattening film 19a is formed in the display region D, the first resin film 19b is formed filling the slit S in the frame region F. Subsequently, when the power source line 20a and the like are formed in the display region D, the first connection wiring line 20c is formed in the frame region F. Further, when the second flattening film 21a is formed covering the power source line 20a and the like in the display region D, the second resin film 21b is formed covering the first connection wiring line 20c in the frame region F.

Organic EL Element Forming Step

The organic EL element 35 is formed by forming, by using a known method, the first electrode 31a, the edge cover 32a, the organic EL layer 33 (the hole injection layer 1, the hole transport layer 2, the light-emitting layer 3, the electron transport layer 4, and the electron injection layer 5), and the second electrode 34 on the second flattening film 21a of the TFT layer 30 formed at the TFT layer forming step described above.

Here, when the edge cover 32a is formed covering the peripheral end portion of the first electrode 31a in the display region D, the third resin film 32b is formed covering the second resin film 21b in the frame region F.

Sealing Film Forming Step

First, in a substrate surface in which the organic EL element 35 formed at the organic EL element forming step described above is formed, the first inorganic film 36 is formed by, for example, forming an inorganic insulating film such as a silicon nitride film, a silicon oxide film, and a silicon oxynitride film, by plasma chemical vapor deposition (CVD) by using a mask.

Subsequently, the organic film 37 is formed by forming an organic resin material such as an acrylic resin by, for example, an ink-jet method in a substrate surface in which the first inorganic film 36 is formed.

Further, in a substrate in which the organic film 37 is formed, the second inorganic film 38 is formed by, for example, forming an inorganic insulating film such as a silicon nitride film, a silicon oxide film, and a silicon oxynitride film by plasma CVD by using a mask, and accordingly the sealing film 40 is formed.

Finally, after a protective sheet (not illustrated) is bonded to a substrate surface in which the sealing film 40 is formed, the resin substrate layer 10 is irradiated with laser light from the glass substrate side. Accordingly, the glass substrate is peeled from a lower face of the resin substrate layer 10, and a protective sheet (not illustrated) is further bonded to the lower face of the resin substrate layer 10 from which the glass substrate has been peeled.

The organic EL display device 50a of the present embodiment can be manufactured in this manner.

As described above, according to the organic EL display device 50a of the present embodiment, the display region D is provided with the plurality of source lines 18f formed of the second metal film, the first flattening film 19a covering each of the source lines 18f, and the plurality of power source lines 20a formed of the third metal film on the first flattening film 19a. Additionally, the bending portion B of the frame region F is provided with the first resin film 19b filling the slit S formed in the base coat film 11, the gate insulating film 13, the first interlayer insulating film 15, and the second interlayer insulating film 17. Then, an upper face of the first resin film 19b is provided with the plurality of first connection wiring lines 20c formed of the third metal film, and the plurality of first connection wiring lines 20c extend in parallel to each other in a direction intersecting the extending direction of the bending portion B. Here, the first resin film 19b that fills the slit S is formed of the same material and in the same layer as those of the first flattening film 19a, and it is unnecessary to separately provide a flattening film only to fill the slit S of the bending portion B, and thus disconnection of the first connection wiring line 20c in the bending portion B of the frame region F can be suppressed at a low cost.

Additionally, according to the organic EL display device 50a of the present embodiment, one of the pair of first connection wiring lines 20c adjacent of the plurality of first connection wiring lines 20c is electrically connected to the first lead-out wiring line 14f and the second lead-out wiring line 14g via the contact holes Ha and Hb formed in the first interlayer insulating film 15 and the second interlayer insulating film 17. Additionally, the other of the pair of first connection wiring lines 20c adjacent is electrically connected to the third lead-out wiring line 16b and the fourth lead-out wiring line 16c via the contact holes Hc and Hd formed in the second interlayer insulating film 17. Here, the first lead-out wiring line 14f and the second lead-out wiring line 14g are formed of the first metal film, and the third lead-out wiring line 16b and the fourth lead-out wiring line 16c are formed of the fourth metal film, and thus the first interlayer insulating film 15 is interposed between the first lead-out wiring line 14f and the second lead-out wiring line 14g, and the third lead-out wiring line 16b and the fourth lead-out wiring line 16c. Accordingly, the first lead-out wiring line 14f and the second lead-out wiring line 14g, and the third lead-out wiring line 16b and the fourth lead-out wiring line 16c can be disposed close to each other, and thus a pitch between adjacent wiring lines in the bending portion B can be narrowed.

Second Embodiment

Figure 9:
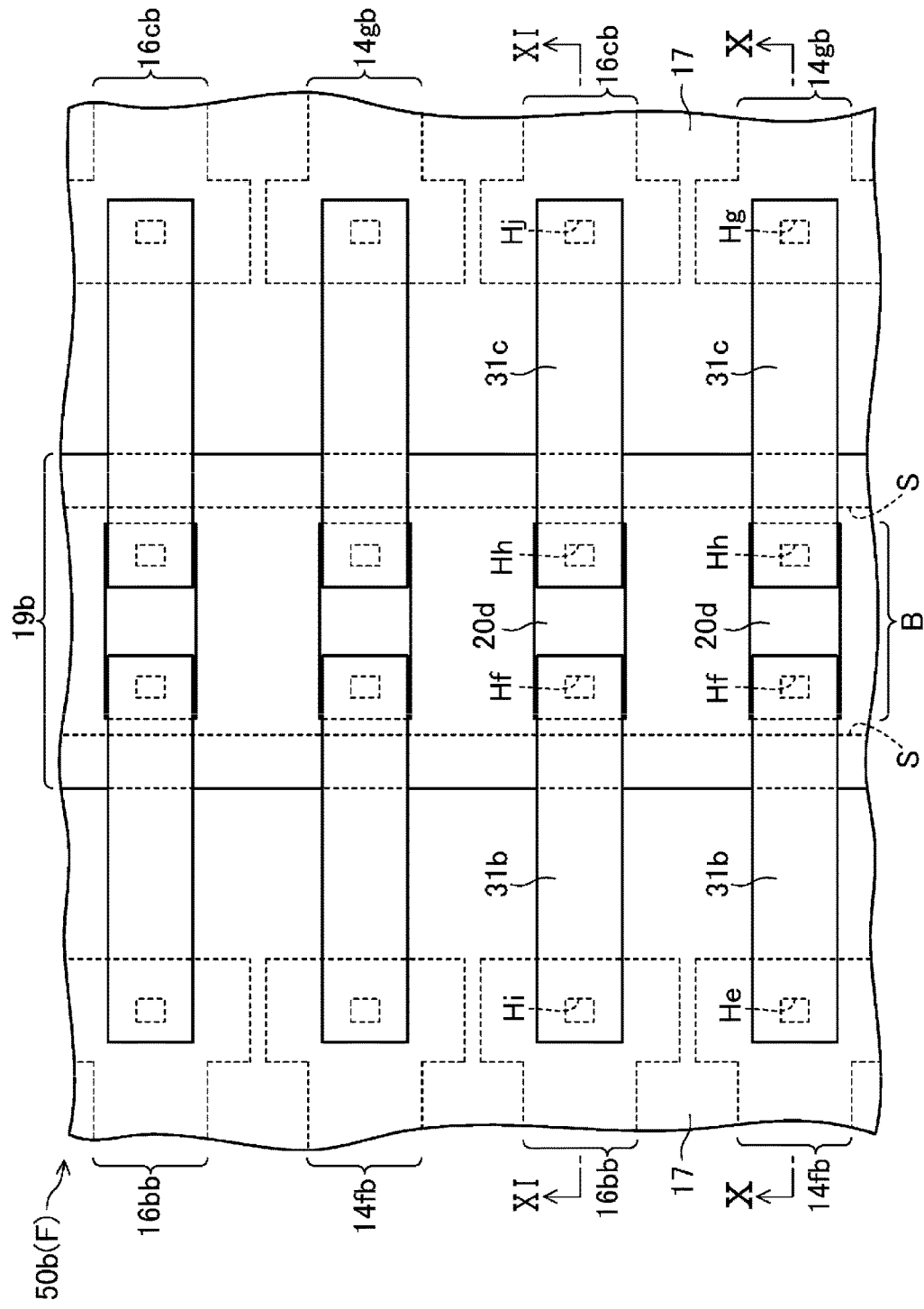
FIG. 9 is a plan view of a frame region including a bending portion of an organic EL display device according to a second embodiment of the disclosure, and is a view corresponding to FIG. 6.
Figure 10:
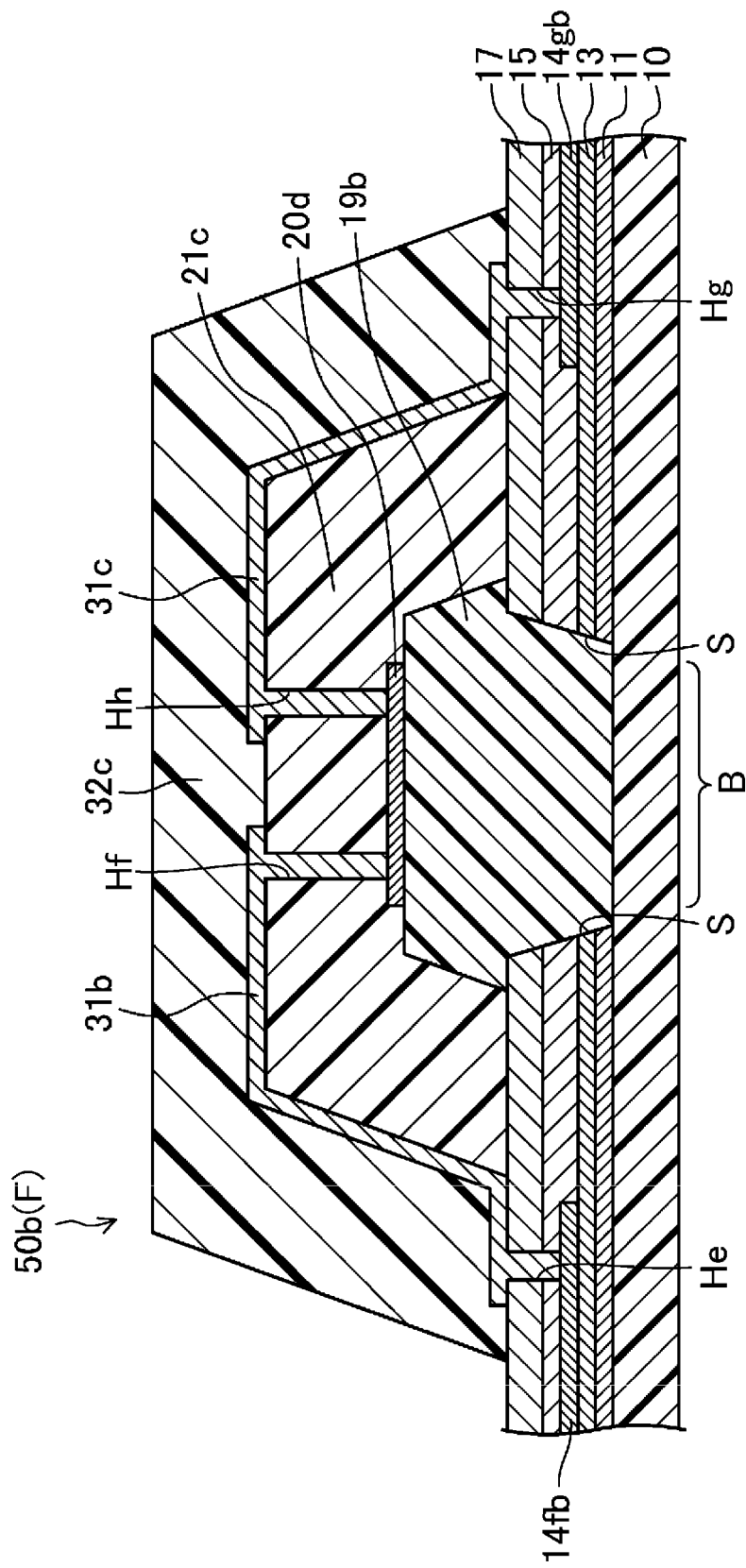
FIG. 10 is a cross-sectional view of the frame region including the bending portion of the organic EL display device taken along line X-X in FIG. 9.
Figure 11:
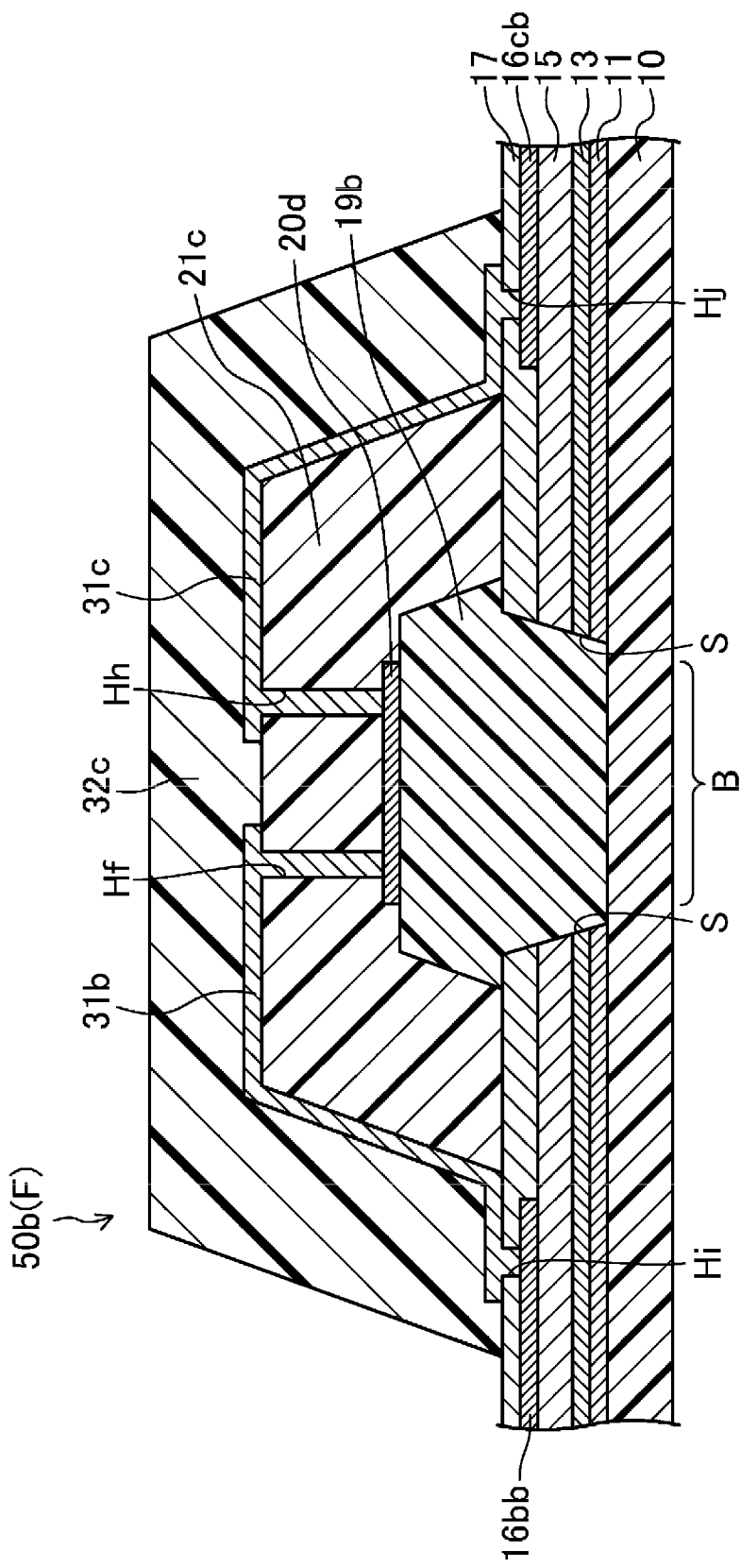
FIG. 11 is a cross-sectional view of the frame region including the bending portion of the organic EL display device taken along line XI-XI in FIG. 9.

FIG. 9 to FIG. 16 illustrate a second embodiment of a display device according to the disclosure. Here, FIG. 9 is a plan view of a frame region F including a bending portion B of an organic EL display device 50b of the present embodiment, and is a view corresponding to FIG. 6. Additionally, FIG. 10 and FIG. 11 are cross-sectional views of the frame region F including the bending portion B of the organic EL display device 50b taken along line X-X and line XI-XI in FIG. 9. Note that, in each of the following embodiments, the same portions as those in FIG. 1 to FIG. 8 are denoted by the same reference signs, and detailed description of these portions are omitted. Additionally, in the plan view of FIG. 9, a second resin film 21c and a third resin film 32c described below are omitted.

While, in the first embodiment described above, the organic EL display device 50a in which the first lead-out wiring line 14f and the second lead-out wiring line 14g are electrically connected via the first connection wiring line 20c is exemplified, in the present embodiment, the organic EL display device 50b in which a first lead-out wiring line 14f and a second lead-out wiring line 14g are electrically connected via a first connection wiring line 20d, a second connection wiring line 31b, and a third connection wiring line 31c.

As with the organic EL display device 50a of the first embodiment described above, the organic EL display device 50b includes a display region D provided in a rectangular shape and the frame region F provided in a frame shape in a periphery of the display region D.

As with the organic EL display device 50a of the first embodiment described above, the organic EL display device 50b includes a resin substrate layer 10, a TFT layer 30 provided on the resin substrate layer 10, an organic EL element 35 provided as a light-emitting element on the TFT layer 30, and a sealing film 40 provided covering the organic EL element 35.

As with the organic EL display device 50a of the first embodiment described above, the organic EL display device 50b includes, in the frame region F, a first dam wall Wa provided in a frame shape outside a trench G and a second dam wall Wb provided in a frame shape in a periphery of the first dam wall Wa.

As illustrated in FIG. 9 to FIG. 11, the organic EL display device 50b includes a first resin film 19b provided filling a slit S formed in the bending portion B of the frame region F, a plurality of the first connection wiring lines 20d provided on the first resin film 19b, the second resin film 21c provided covering each of the first connection wiring lines 20d, a plurality of the second connection wiring lines 31b and a plurality of the third connection wiring lines 31c provided on the second resin film 21c, and the third resin film 32c provided covering each of the second connection wiring lines 31b and each of the third connection wiring lines 31c.

As illustrated in FIG. 9 and FIG. 10, in the display region D side (left side in the figures) of the slit S, a plurality of first lead-out wiring lines 14fb formed of the first metal film described above are provided extending in parallel to each other in a direction orthogonal to the extending direction of the bending portion B. Additionally, as illustrated in FIG. 9 and FIG. 11, in the display region D side (left side in the figures) of the slit S a plurality of third lead-out wiring lines 16bb formed of the fourth metal film described above are provided extending in parallel to each other in a direction orthogonal to the extending direction of the bending portion B. Note that, as illustrated in FIG. 9, each of the third lead-out wiring lines 16bb is provided adjacent to each of the first lead-out wiring lines 14fb. Additionally, the first lead-out wiring lines 14fb and the third lead-out wiring lines 16bb are electrically connected, via a lead-out wiring line (not illustrated), to a signal wiring line (a gate line 14d, a light emission control line 14*e*, a source line 18*f*, a power source line 20*a*, and the like) extending to the display region D.

As illustrated in FIG. 9 and FIG. 10, in the terminal portion T side (right side in the figures) of the slit S, a plurality of second lead-out wiring lines 14*gb* formed of the first metal film described above are provided extending in parallel to each other in a direction orthogonal to the extending direction of the bending portion B. Additionally, as illustrated in FIG. 9 and FIG. 11, in the terminal portion T side (right side in the figures) of the slit S a plurality of fourth lead-out wiring lines 16*cb* formed of the fourth metal film described above are provided extending in parallel to each other in a direction orthogonal to the extending direction of the bending portion B. Note that, as illustrated in FIG. 9, each of the fourth lead-out wiring lines 16*cb* is provided adjacent to each of the second lead-out wiring lines 14*gb*. Additionally, the second lead-out wiring lines 14*gb* and the fourth lead-out wiring lines 16*cb* are electrically connected to a terminal E of a terminal portion T via another lead-out wiring line (not illustrated).

The plurality of first connection wiring lines 20*d* are formed of the third metal film described above and, as illustrated in FIG. 9, are provided extending in parallel to each other in a direction orthogonal to the extending direction of the bending portion B.

The second resin film 21*c* is formed of the same material and in the same layer as those of a second flattening film 21*a*.

The plurality of second connection wiring lines 31*b* are formed of the same material and in the same layer as those of each of first electrodes 31*a* and, as illustrated in FIG. 9 to FIG. 11, in the display region D side (left side in the figures) of an upper face of the second resin film 21*c*, the plurality of second connection wiring lines 31*b* are provided extending in parallel to each other in a direction orthogonal to the extending direction of the bending portion B, and extending on a side surface in the display region D side (left side in the figures) of the second resin film 21*c* and on a second interlayer insulating film 17.

The plurality of third connection wiring lines 31*c* are formed of the same material and in the same layer as those of each of the first electrodes 31*a* and, as illustrated in FIG. 9 to FIG. 11, in the terminal portion T side (right side in the figures) of the upper face of the second resin film 21*c*, the plurality of third connection wiring lines 31*c* are provided extending in parallel to each other in a direction orthogonal to the extending direction of the bending portion B and extending on a side surface in the terminal portion T side (right side in the figures) of the second resin film 21*c* and on the second interlayer insulating film 17.

The third resin film 32*c* is formed of the same material and in the same layer as those of an edge cover 32*a*.

Here, as illustrated in FIG. 9 and FIG. 10, an end portion in the display region D side (left side in the figures) of one of a pair of the first connection wiring lines 20*d* adjacent is electrically connected to the first lead-out wiring line 14*fb* via a contact hole Hf formed in the second resin film 21*c*, the second connection wiring line 31*b*, and a contact hole He formed in a first interlayer insulating film 15 and the second interlayer insulating film 17. Additionally, as illustrated in FIG. 9 and FIG. 11, an end portion in the display region D side (left side in the figures) of the other of the pair of first connection wiring lines 20*d* adjacent is electrically connected to the third lead-out wiring line 16*bb* via the contact hole Hf formed in the second resin film 21*c*, the second connection wiring line 31*b*, and a contact hole Hi formed in the second interlayer insulating film 17. Further, as illustrated in FIG. 9 and FIG. 10, an end portion in the terminal portion T side (right side in the figures) of one of the pair of first connection wiring lines 20*d* adjacent is electrically connected to the second lead-out wiring line 14*gb* via a contact hole Hh formed in the second resin film 21*c*, the third connection wiring line 31*c*, and a contact hole Hg formed in the first interlayer insulating film 15 and the second interlayer insulating film 17. Additionally, as illustrated in FIG. 9 and FIG. 11, an end portion in the terminal portion T side (right side in the figures) of the other of the pair of first connection wiring lines 20*d* adjacent is electrically connected to the fourth lead-out wiring line 16*cb* via a contact hole Hh formed in the second resin film 21*c*, the third connection wiring line 31*c*, and a contact hole Hj formed in the second interlayer insulating film 17.

As with the organic EL display device 50*a* of the first embodiment described above, the organic EL display device 50*b* described above has flexibility and is configured to display an image by causing a light-emitting layer 3 of an organic EL layer 33 to emit light as appropriate via a first TFT 9*a*, a second TFT 9*b*, and a third TFT 9*c* in each subpixel P.

Figure 12:
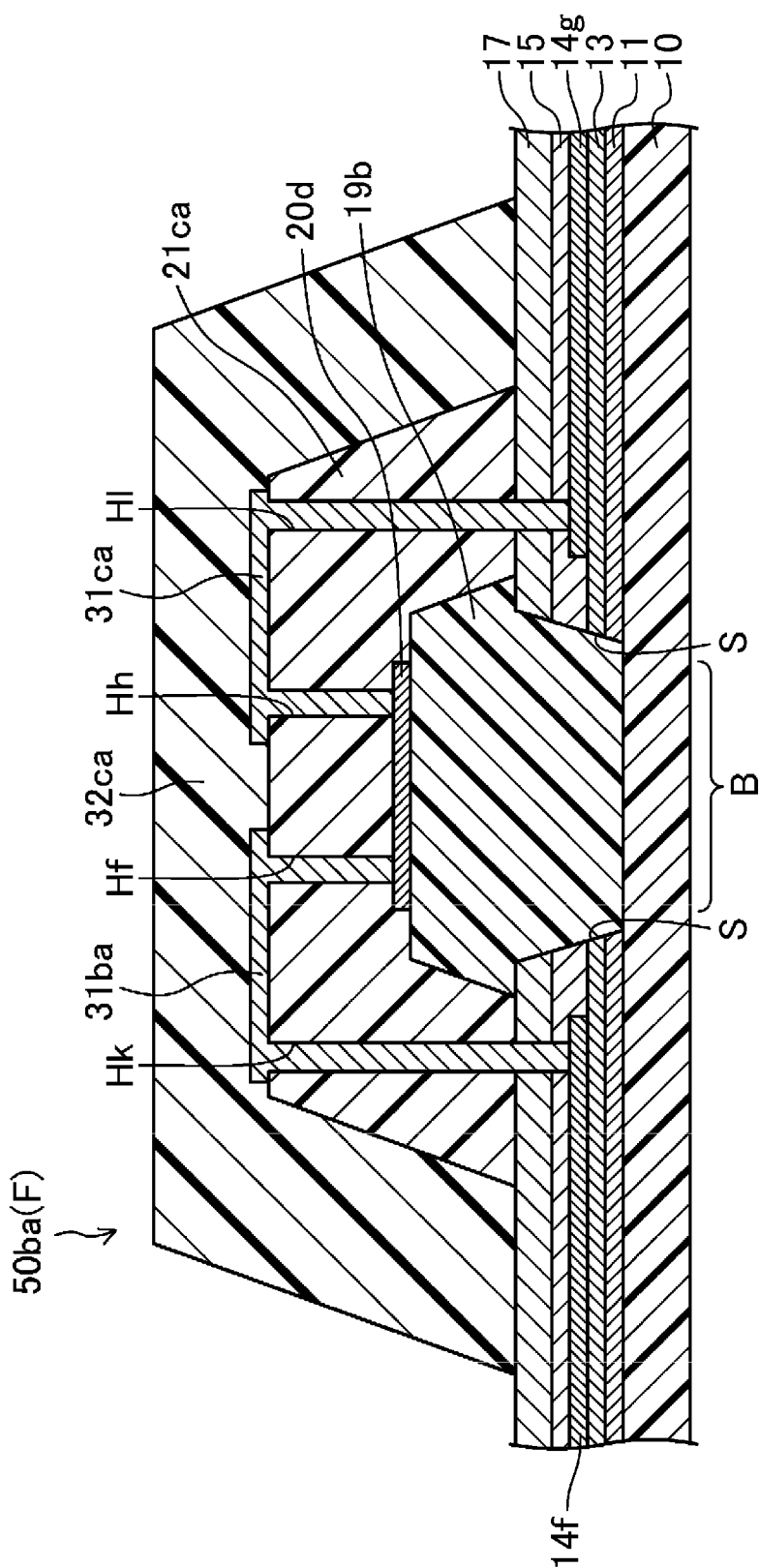
FIG. 12 is a cross-sectional view of a frame region including a bending portion of an organic EL display device according to modification example 1 of the second embodiment of the disclosure, and is a view corresponding to FIG. 10.
Figure 13:
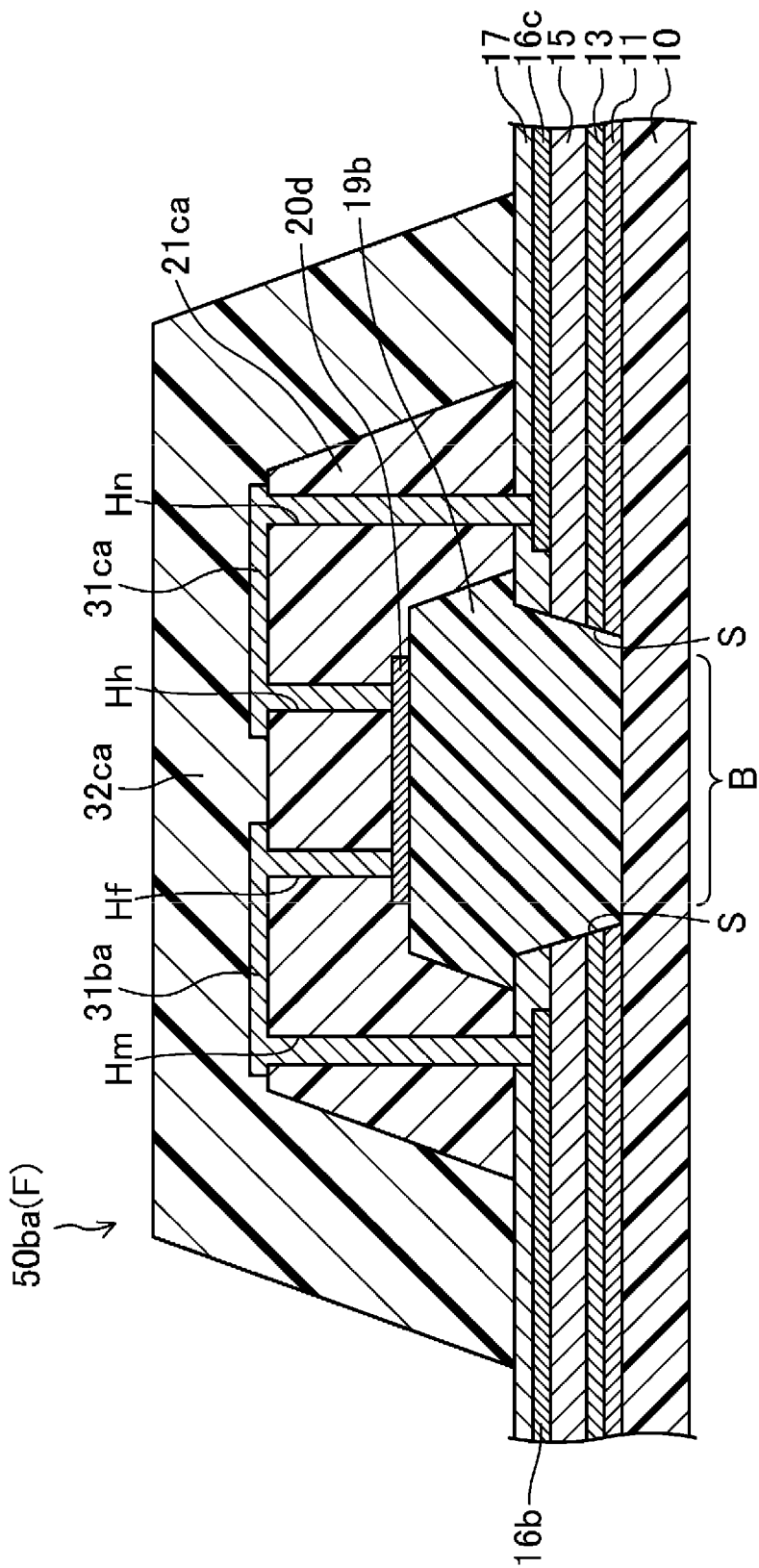
FIG. 13 is a cross-sectional view of the frame region including the bending portion of the organic EL display device according to modification example 1 of the second embodiment of the disclosure, and is a view corresponding to FIG. 11.

Note that in the present embodiment, the organic EL display device 50*b* in which the second connection wiring line 31*b* and the third connection wiring line 31*c* extend to the side surface of the second resin film 21*c* is exemplified, but as illustrated in FIG. 12 and FIG. 13, the organic EL display device may be an organic EL display device 50*ba* in which a second connection wiring line 31*ba* and a third connection wiring line 31*ca* are formed only in an upper face of a second resin film 21*ca*. Here, FIG. 12 and FIG. 13 are cross-sectional views of a frame region F including a bending portion B of the organic EL display device 50*ba* that is modification example 1 of the organic EL display device 50*b*, and are views corresponding to FIG. 10 and FIG. 11.

Specifically, as illustrated in FIG. 12 and FIG. 13, in the organic EL display device 50*ba*, in the display region D side (left side in the figures) of the upper face of the second resin film 21*ca* corresponding to the second resin film 21*c* of the organic EL display device 50*b*, a plurality of the second connection wiring lines 31*ba* formed of the same material and in the same layer as those of each of first electrodes 31*a* are provided extending in parallel to each other in a direction orthogonal to the extending direction of the bending portion B. Additionally, in the organic EL display device 50*ba*, as illustrated in FIG. 12 and FIG. 13, in the terminal portion T side (right side in the figures) of the upper face of the second resin film 21*ca*, a plurality of the third connection wiring lines 31*ca* formed of the same material and in the same layer as those of each of the first electrodes 31*a* are provided extending in parallel to each other in a direction orthogonal to the extending direction of the bending portion B. Here, as illustrated in FIG. 12, the display region D side (left side in the figure) of the second connection wiring line 31*ba* is electrically connected to a first lead-out wiring line 14*f* via a contact hole Hk formed in the second resin film 21*ca*, a second interlayer insulating film 17, and a first interlayer insulating film 15, or as illustrated in FIG. 13, the display region D side of the second connection wiring line 31*ba* is electrically connected to a third lead-out wiring line 16*b* via a contact hole Hm formed in the second resin film 21*ca* and the second interlayer insulating film 17. Additionally, as illustrated in FIG. 12, the terminal portion T side (right side in the figure) of the third connection wiring line 31*ca* is electrically connected to a first lead-out wiring line 14*g* via a contact hole Hl formed in the second resin film 21*ca*, the second interlayer insulating film 17, and the first interlayer insulating film 15, or as illustrated in FIG. 13, the terminal portion T side of the third connection wiring line 31ca is electrically connected to a third lead-out wiring line 16c via a contact hole Hn formed in the second resin film 21ca and the second interlayer insulating film 17.

Figure 14:
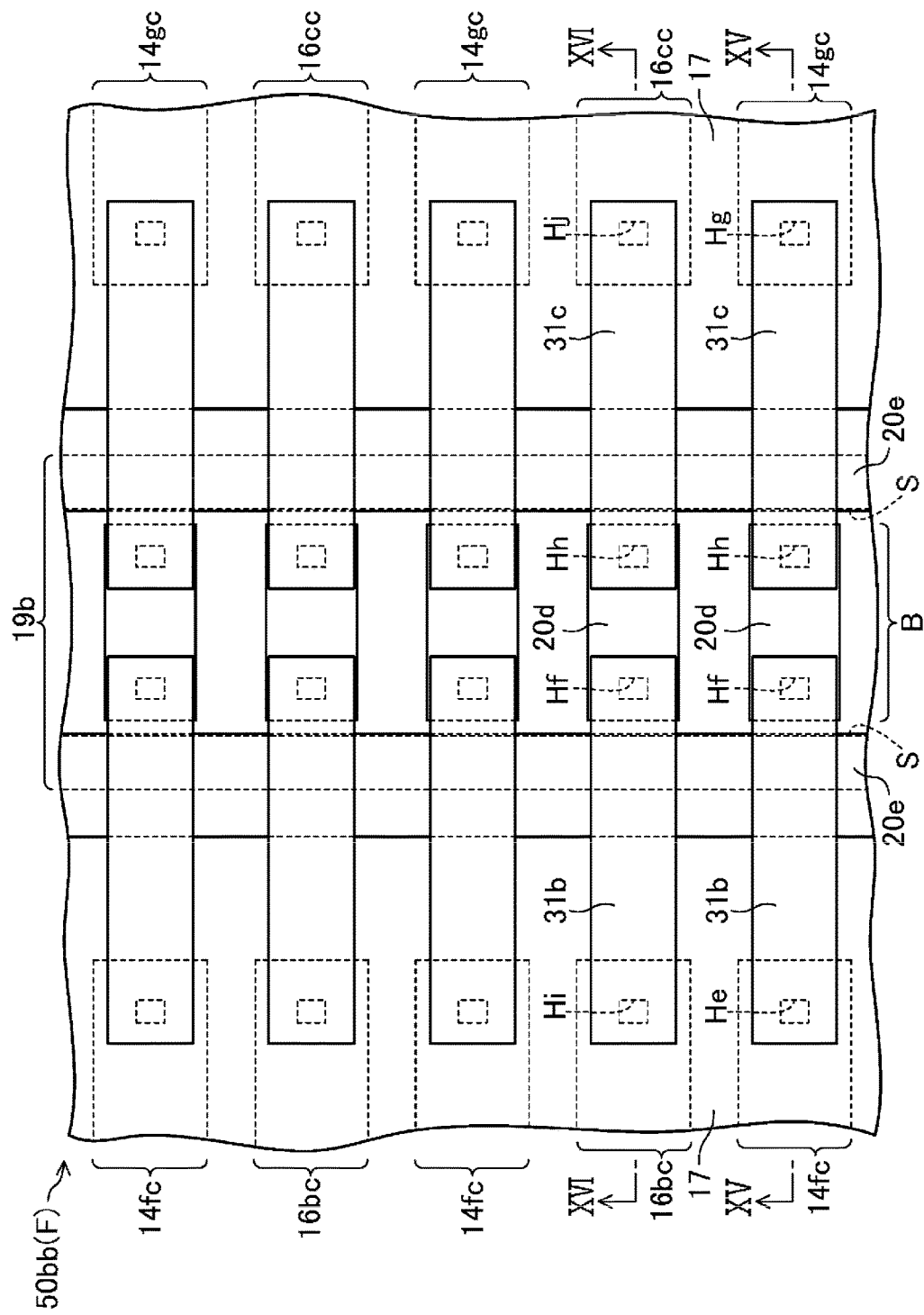
FIG. 14 is a plan view of a frame region including a bending portion of an organic EL display device according to modification example 2 of the second embodiment of the disclosure, and is a view corresponding to FIG. 6.
Figure 15:
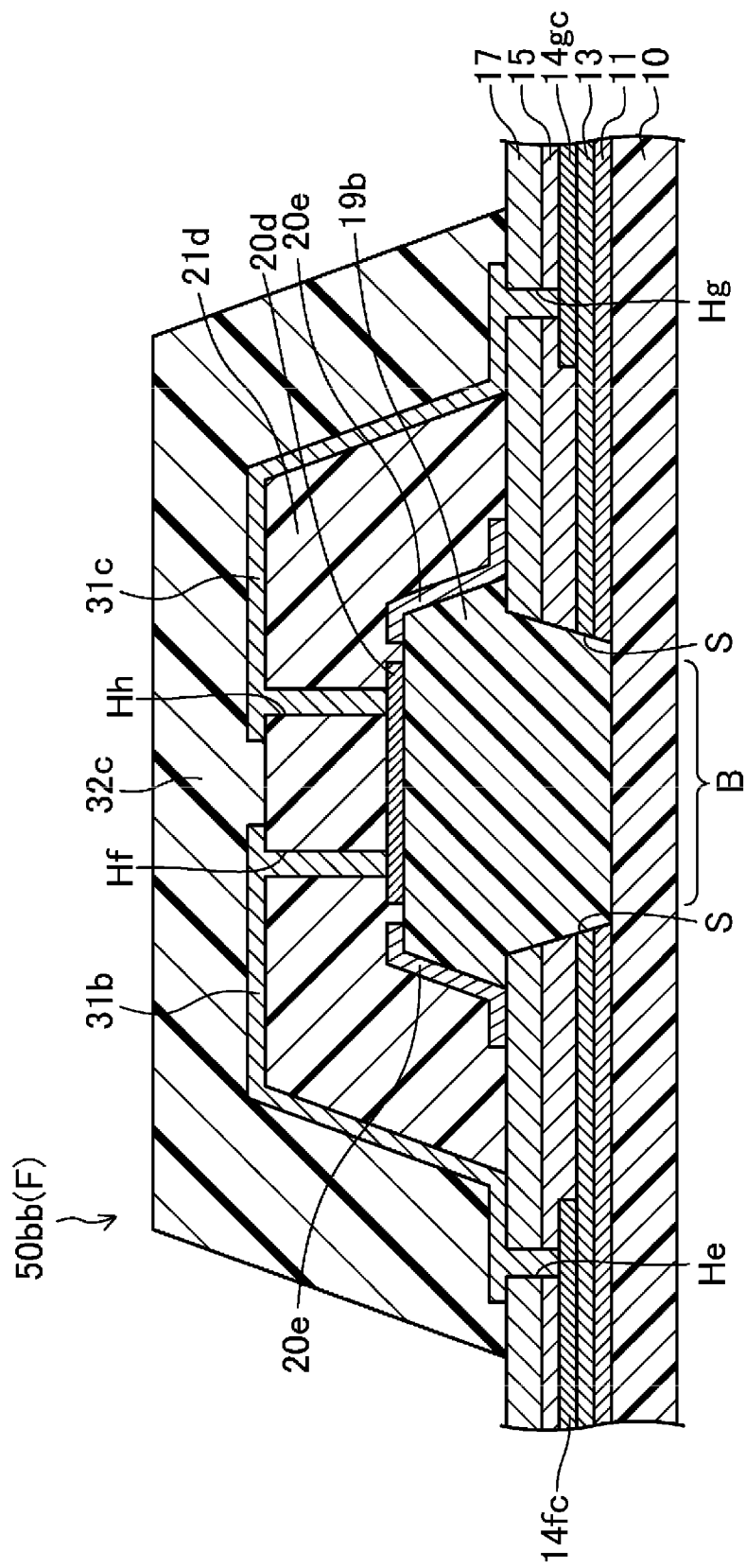
FIG. 15 is a cross-sectional view of the frame region including the bending portion of the organic EL display device taken along line XV-XV in FIG. 14.
Figure 16:
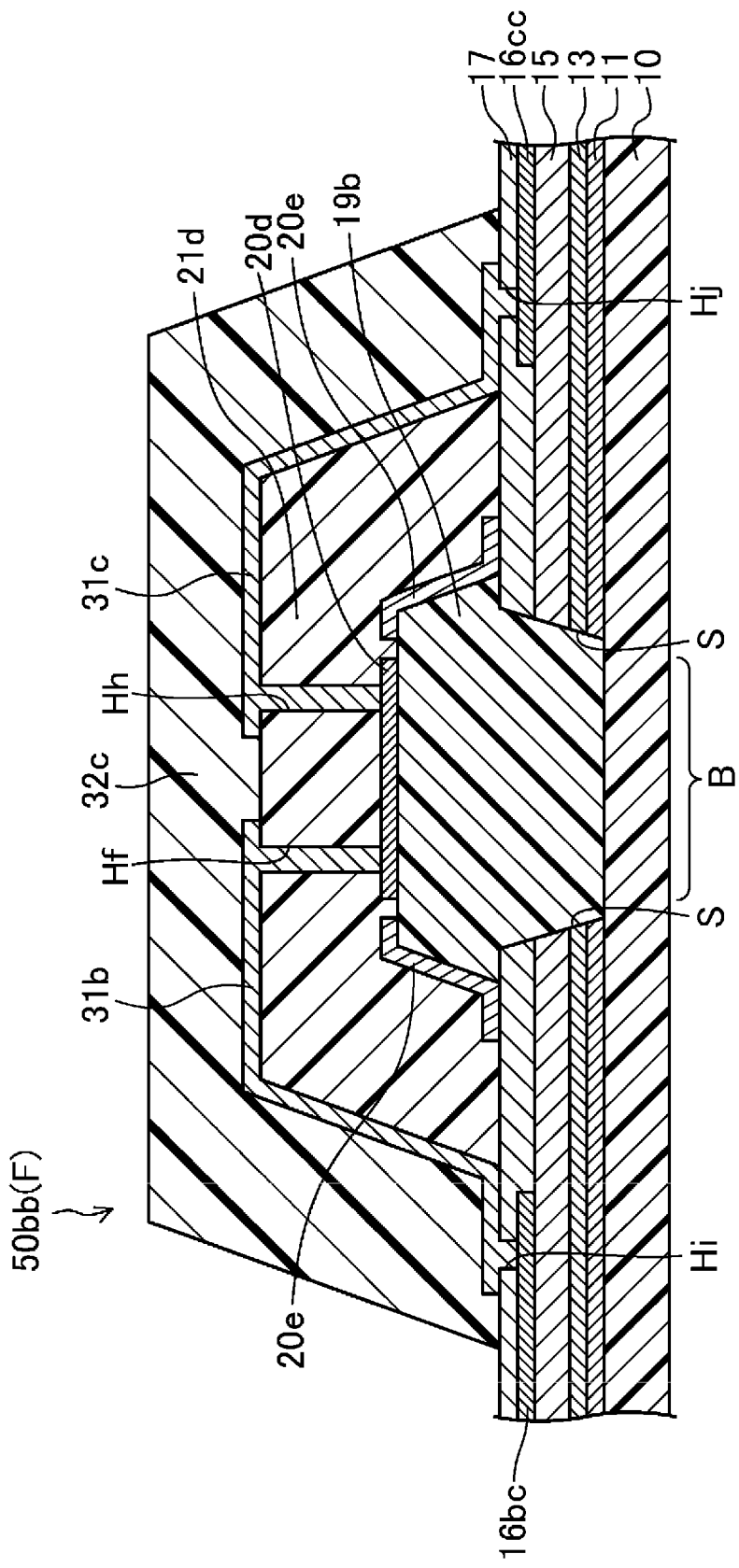
FIG. 16 is a cross-sectional view of the frame region including the bending portion of the organic EL display device taken along line XVI-XVI in FIG. 14.

Additionally, in the present embodiment, the organic EL display device 50b in which the side surface of the first resin film 19b is exposed from the metal layer is exemplified, but as illustrated in FIG. 14 to FIG. 16, the organic EL display device may be an organic EL display device 50bb in which a side surface of a first resin film 19b is covered by a metal layer 20e. Here, FIG. 14 is a plan view of a frame region F including a bending portion B of the organic EL display device 50bb of modification example 2 of the organic EL display device 50b, and is a view corresponding to FIG. 6. Additionally, FIG. 15 and FIG. 16 are cross-sectional views of the frame region including the bending portion of the organic EL display device taken along line XV-XV and line XVI-XVI in FIG. 14. Note that, in the plan view of FIG. 14, a second resin film 21d and a third resin film 32c described below are omitted.

Specifically, as illustrated in FIG. 14 to FIG. 16, the organic EL display device 50bb includes the first resin film 19b provided filling a slit S formed in the bending portion B of the frame region F, a plurality of first connection wiring lines 20d provided on the first resin film 19b, a metal layer 20e provided in a side surface of the first resin film 19b, the second resin film 21d provided covering each of the first connection wiring lines 20d and the metal layer 20e, a plurality of second connection wiring lines 31b and a plurality of third connection wiring lines 31c provided on the second resin film 21d, and the third resin film 32c provided covering each of the second connection wiring lines 31b and each of the third connection wiring lines 31c. Here, the metal layer 20e is formed of the third metal film described above and, as illustrated in FIG. 14 to FIG. 16, the metal layer 20e is provided covering a side surface of the first resin film 19b.

As illustrated in FIG. 14 and FIG. 15, in the display region D side (left side in the figures) of the slit S, a plurality of first lead-out wiring lines 14fc formed of the first metal film described above are provided extending in parallel to each other in a direction orthogonal to the extending direction of the bending portion B. Additionally, as illustrated in FIG. 14 and FIG. 16, in the display region D side (left side in the figures) of the slit S, a plurality of third lead-out wiring lines 16bc formed of the fourth metal film described above are provided extending in parallel to each other in a direction orthogonal to the extending direction of the bending portion B. Note that, as illustrated in FIG. 14, each of the third lead-out wiring lines 16bc is provided adjacent to each of the first lead-out wiring lines 14fc. Additionally, the first lead-out wiring lines 14fc and the third lead-out wiring lines 16bc are electrically connected, via a lead-out wiring line (not illustrated), to a signal wiring line (a gate line 14d, a light emission control line 14e, a source line 18f, a power source line 20a, and the like) extending to the display region D. Further, as illustrated in FIG. 14 and FIG. 15, in the terminal portion T side (right side in the figures) of the slit S, a plurality of second lead-out wiring lines 14gc formed of the first metal film described above are provided extending in parallel to each other in a direction orthogonal to the extending direction of the bending portion B. Additionally, as illustrated in FIG. 14 and FIG. 16, in the terminal portion T side (right side in the figures) of the slit S, a plurality of fourth lead-out wiring lines 16cc formed of the fourth metal film described above are provided extending in parallel to each other in a direction orthogonal to the extending direction of the bending portion B. Note that, as illustrated in FIG. 14, each of the fourth lead-out wiring lines 16cc is provided adjacent to each of the second lead-out wiring lines 14gc. Additionally, the second lead-out wiring lines 14gc and the fourth lead-out wiring lines 16cc are electrically connected to a terminal E of a terminal portion T via another lead-out wiring line (not illustrated).

As illustrated in FIG. 14 and FIG. 15, an end portion in the display region D side (left side in the figures) of one of a pair of the first connection wiring lines 20d adjacent is electrically connected to the first lead-out wiring line 14fc via a contact hole Hf formed in the second resin film 21d, the second connection wiring line 31b, and a contact hole He formed in a first interlayer insulating film 15 and a second interlayer insulating film 17. Additionally, as illustrated in FIG. 14 and FIG. 16, an end portion in the display region D side (left side in the figures) of the other of the pair of first connection wiring lines 20d adjacent is electrically connected to the third lead-out wiring line 16bc via the contact hole Hf formed in the second resin film 21d, the second connection wiring line 31b, and a contact hole Hi formed in the second interlayer insulating film 17. Further, as illustrated in FIG. 14 and FIG. 15, an end portion in the terminal portion T side (right side in the figures) of one of the pair of first connection wiring lines 20d adjacent is electrically connected to the second lead-out wiring line 14gc via a contact hole Hh formed in the second resin film 21d, the third connection wiring line 31c, and a contact hole Hg formed in the first interlayer insulating film 15 and the second interlayer insulating film 17. Additionally, as illustrated in FIG. 14 and FIG. 16, an end portion in the terminal portion T side (right side in the figures) of the other of the pair of first connection wiring lines 20d adjacent is electrically connected to the fourth lead-out wiring line 16cc via the contact hole Hh formed in the second resin film 21d, the third connection wiring line 31c, and a contact hole Hj formed in the second interlayer insulating film 17.

According to the organic EL display device 50bb described above, at least the side surface of the first resin film 19b is covered by the metal layer 20e and thus, in dry etching performed when the first connection wiring line 20d is formed on an upper face of the first resin film 19b, etching of a surface layer of the first resin film 19b can be suppressed, and contamination inside a chamber of a dry etching device can be suppressed.

Note that in modification example 2, the configuration in which the metal layer 20e is provided in the side surface of the first resin film 19b of the organic EL display device 50b of the present embodiment is exemplified, but the metal layer 20e may be provided in a side surface of the first resin film 19b of the organic EL display device 50ba of modification example 1 described above.

The organic EL display device 50b of the present embodiment can be manufactured in the method for manufacturing the organic EL display device 50a of the first embodiment described above by modifying the pattern shape of the first connection wiring line 20c, and forming the second connection wiring line 31b and the third connection wiring line 31c when the first electrode 31a is formed.

As described above, according to the organic EL display device 50b of the present embodiment, the display region D is provided with a plurality of the source lines 18f formed of the second metal film, a first flattening film 19a covering each of the source lines 18f, and a plurality of the power source lines 20a formed of the third metal film on the first flattening film 19a. Additionally, the bending portion B of the frame region F is provided with the first resin film 19*b* filling the slit S formed in a base coat film 11, the gate insulating film 13, the first interlayer insulating film 15, and the second interlayer insulating film 17. Then, an upper face of the first resin film 19*b* is provided with the plurality of first connection wiring lines 20*d* formed of the third metal film, and the plurality of first connection wiring lines 20*d* extend in parallel to each other in a direction intersecting the extending direction of the bending portion B. Here, the first resin film 19*b* that fills the slit S is formed of the same material and in the same layer as those of the first flattening film 19*a*, and it is unnecessary to separately provide a flattening film only to fill the slit S of the bending portion B, and thus disconnection of the first connection wiring line 20*d* in the bending portion B of the frame region F can be suppressed at a low cost.

Additionally, according to the organic EL display device 50*b* of the present embodiment, one of the pair of first connection wiring lines 20*d* adjacent of the plurality of first connection wiring lines 20*d* is electrically connected to the first lead-out wiring line 14*fb* via the contact hole Hf formed in the second resin layer 21*c*, the second connection wiring line 31*b*, and the contact hole He formed in the first interlayer insulating film 15 and the second interlayer insulating film 17, and is also electrically connected to the second lead-out wiring line 14*gb* via the contact hole Hh formed in the second resin film 21*c*, the third connection wiring line 31*c*, and the contact hole Hg formed in the first interlayer insulating film 15 and the second interlayer insulating film 17. Additionally, the other of the pair of first connection wiring lines 20*d* adjacent is electrically connected to the third lead-out wiring line 16*bb* via the contact hole Hf formed in the second resin layer 21*c*, the second connection wiring line 31*b*, and the contact hole Hi formed in the second interlayer insulating film 17, and is also electrically connected to the fourth lead-out wiring line 16*cb* via the contact hole Hh formed in the second resin film 21*c*, the third connection wiring line 31*c*, and the contact hole Hj formed in the second interlayer insulating film 17. Here, the first lead-out wiring line 14*fb* and the second lead-out wiring line 14*gb* are formed of the first metal film, and the third lead-out wiring line 16*bb* and the fourth lead-out wiring line 16*cb* are formed of the fourth metal film, and thus the first interlayer insulating film 15 is interposed between the first lead-out wiring line 14*fb* and the second lead-out wiring line 14*gb*, and the third lead-out wiring line 16*bb* and the fourth lead-out wiring line 16*cb*. Accordingly, the first lead-out wiring line 14*fb* and the second lead-out wiring line 14*gb*, and the third lead-out wiring line 16*bb* and the fourth lead-out wiring line 16*cb* can be disposed close to each other, and thus a pitch between adjacent wiring lines in the bending portion B can be narrowed.

Third Embodiment

Figure 17:
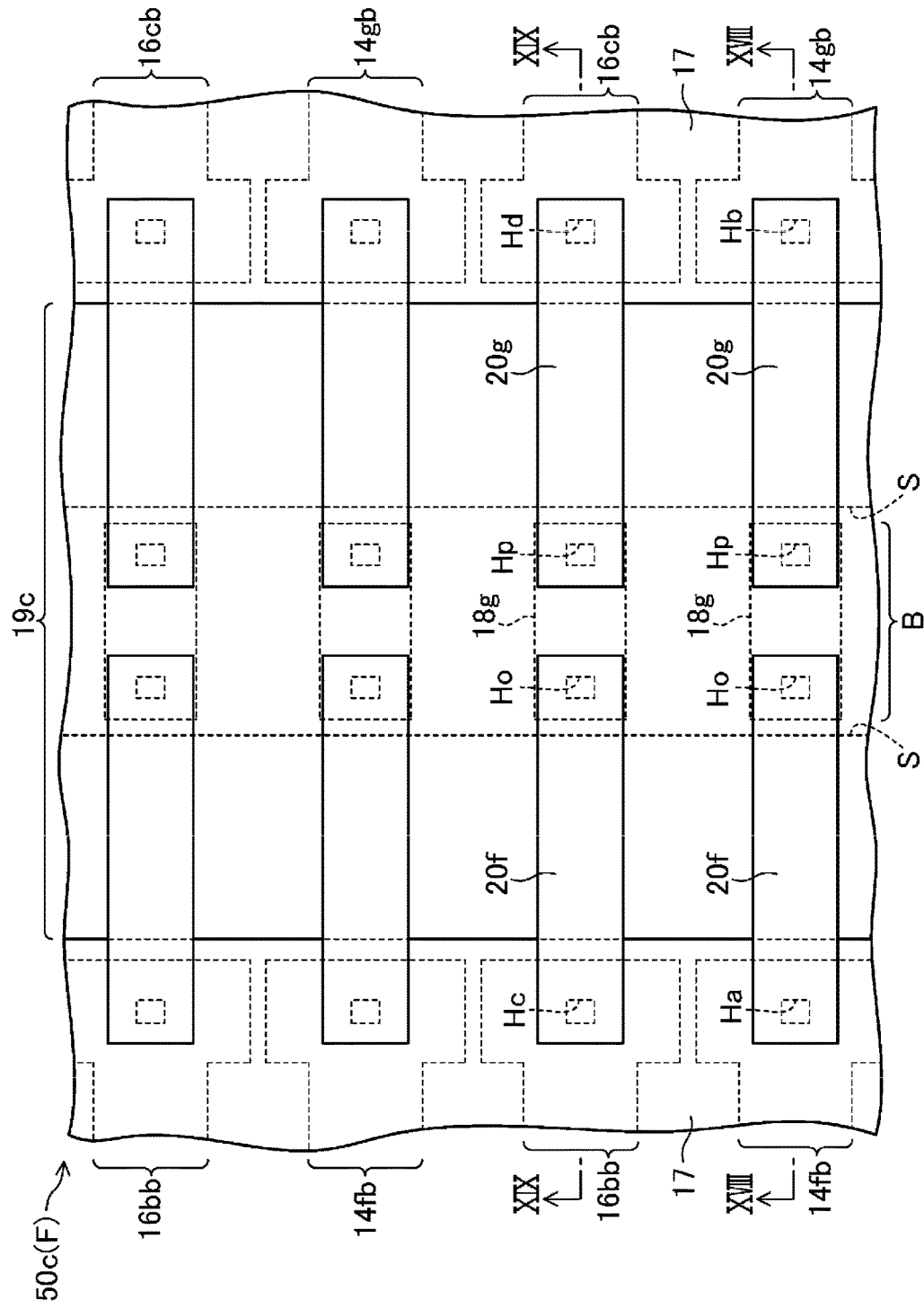
FIG. 17 is a plan view of a frame region including a bending portion of an organic EL display device according to a third embodiment of the disclosure, and is a view corresponding to FIG. 6.
Figure 18:
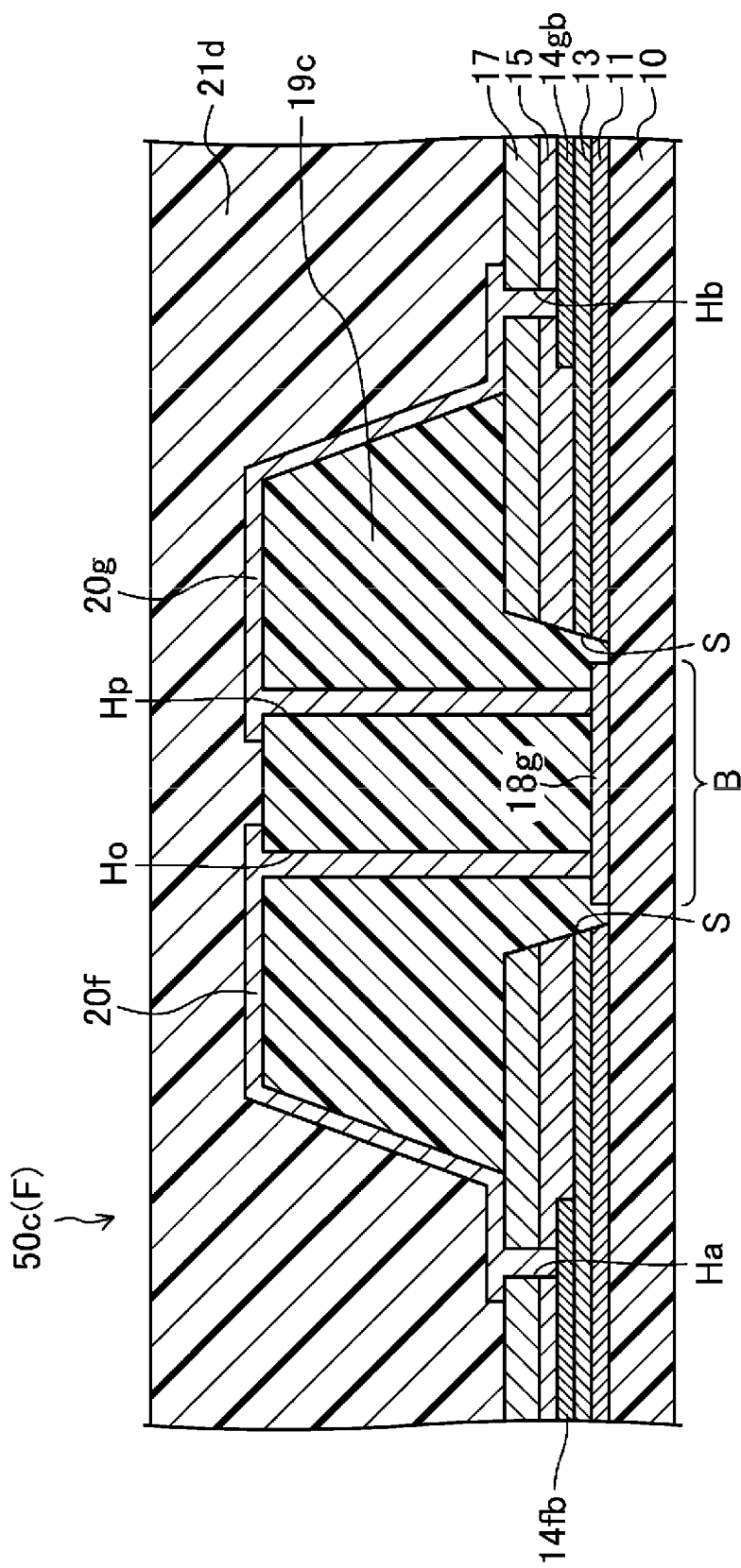
FIG. 18 is a cross-sectional view of the frame region including the bending portion of the organic EL display device taken along line XVIII-XVIII in FIG. 17.
Figure 19:
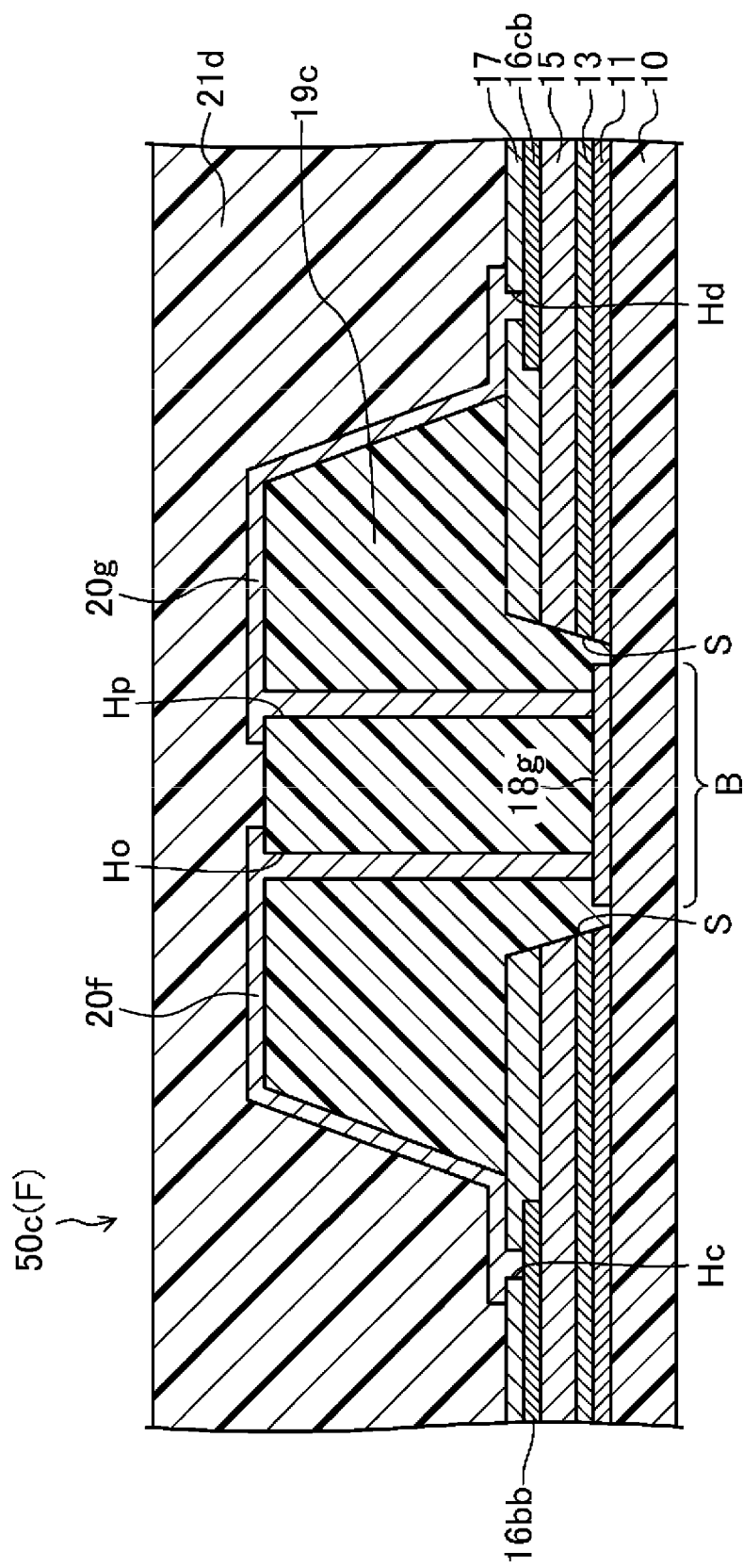
FIG. 19 is a cross-sectional view of the frame region including the bending portion of the organic EL display device taken along line XIX-XIX in FIG. 17.

FIG. 17 to FIG. 22 illustrate a third embodiment of a display device according the disclosure. Here, FIG. 17 is a plan view of a frame region F including a bending portion B of an organic EL display device 50*c* of the present embodiment, and is a view corresponding to FIG. 6. Additionally, FIG. 18 and FIG. 19 are cross-sectional views of the frame region including the bending portion of the organic EL display device 50*c* taken along line XVIII-XVIII and line XIX-XIX in FIG. 17.

In the first and second embodiments described above, the organic EL display devices 50*a* and 50*b* in which the first connection wiring lines 20*c* and 20*d* are integrally formed in the display region D side and the terminal portion T side are exemplified, but the organic EL display device 50*c* in which first connection wiring lines are formed separately from the display region D side and the terminal portion T side will be exemplified.

As with the organic EL display device 50*a* of the first embodiment described above, the organic EL display device 50*c* includes a display region D provided in a rectangular shape and the frame region F provided in a frame shape in a periphery of the display region D.

As with the organic EL display device 50*a* of the first embodiment described above, the organic EL display device 50*c* includes a resin substrate layer 10, a TFT layer 30 provided on the resin substrate layer 10, an organic EL element 35 provided as a light-emitting element on the TFT layer 30, and a sealing film 40 provided covering the organic EL element 35.

As with the organic EL display device 50*a* of the first embodiment described above, the organic EL display device 50*c* includes, in the frame region F, a first dam wall Wa provided in a frame shape outside a trench G and a second dam wall Wb provided in a frame shape in a periphery of the first dam wall Wa.

As illustrated in FIG. 17 to FIG. 19, the organic EL display device 50*c* includes a plurality of lower layer connection wiring lines 18*g* provided at a base of a slit S formed in the bending portion B of the frame region F, a first resin film 19*c* provided covering each of the lower layer connection wiring lines 18*g* and filling the slit S, a plurality of display side first connection wiring lines 20*f* and a plurality of terminal side first connection wiring lines 20*g* provided on the first resin film 19*c*, and a second resin film 21*d* provided covering each of the display side first connection wiring lines 20*f* and each of the terminal side first connection wiring lines 20*g*.

The plurality of lower layer connection wiring lines 18*g* are formed of the second metal film described above and, as illustrated in FIG. 17, the plurality of lower layer connection wiring lines 18*g* are provided extending in parallel to each other in a direction orthogonal to the extending direction of the bending portion B.

The plurality of display side first connection wiring lines 20*f* are formed of the third metal film described above and, as illustrated in FIG. 17 to FIG. 19, in the display region D side (left side in the figures) of an upper face of the first resin film 19*c*, the plurality of display side first connection wiring lines 20*f* are provided extending in parallel to each other in a direction orthogonal to the extending direction of the bending portion B, and extending on a side surface in the display region D side (left side in the figures) of the first resin film 19*c* and on a second interlayer insulating film 17.

The plurality of terminal side first connection wiring lines 20*g* are formed of the third metal film described above and, as illustrated in FIG. 17 to FIG. 19, in the terminal portion T side (right side in the figures) of the upper face of the first resin film 19*c*, the plurality of terminal side first connection wiring lines 20*g* are provided extending in parallel to each other in a direction orthogonal to the extending direction of the bending portion B, and extending to a side surface in the terminal portion T side (right side in the figures) of the first resin film 19*c* and on the second interlayer insulating film 17.

The second resin film 21*d* is formed of the same material and in the same layer as those of a second flattening film 21*a*.

Here, as illustrated in FIG. 17 and FIG. 18, an end portion in the display region D side (left side in the figures) of one of a pair of the display side first connection wiring lines 20*f* adjacent is electrically connected to a first lead-out wiring line 14*fb* via a contact hole Ha formed in a first interlayer insulating film 15 and the second interlayer insulating film 17. Additionally, as illustrated in FIG. 17 and FIG. 19, an end portion in the display region D side (left side in the figures) of the other of the pair of display side first connection wiring lines 20*f* adjacent is electrically connected to a third lead-out wiring line 16*bb* via a contact hole He formed in the second interlayer insulating film 17. Additionally, as illustrated in FIG. 17 to FIG. 19, end portions in the terminal portion T side (right side in the figures) of both of the pair of display side first connection wiring lines 20*f* adjacent are electrically connected to the display region D side (left side in the figures) of the lower layer connection wiring line 18*g* via a pair of contact holes Ho formed in the first resin film 19*c*.

Additionally, as illustrated in FIG. 17 and FIG. 18, an end portion in the terminal portion T side (right side in the figures) of one of a pair of the terminal side first connection wiring lines 20*g* adjacent is electrically connected to a second lead-out wiring line 14*gb* via a contact hole Hb formed in the first interlayer insulating film 15 and the second interlayer insulating film 17. Additionally, as illustrated in FIG. 17 and FIG. 19, an end portion in the terminal portion T side (right side in the figures) of the other of the pair of terminal side first connection wiring lines 20*g* adjacent is electrically connected to a third lead-out wiring line 16*cb* via a contact hole Hd formed in the second interlayer insulating film 17. Additionally, as illustrated in FIG. 17 to FIG. 19, end portions in the display region D side (left side in the figures) of both of the pair of terminal side first connection wiring lines 20*g* adjacent are electrically connected to the terminal portion T side (right side in the figures) of the lower layer connection wiring line 18*g* via a pair of contact holes Hp formed in the first resin film 19*c*.

As with the organic EL display device 50*a* of the first embodiment described above, the organic EL display device 50*c* described above has flexibility and is configured to display an image by causing a light-emitting layer 3 of an organic EL layer 33 to emit light as appropriate via a first TFT 9*a*, a second TFT 9*b*, and a third TFT 9*c* in each subpixel P.

Figure 20:
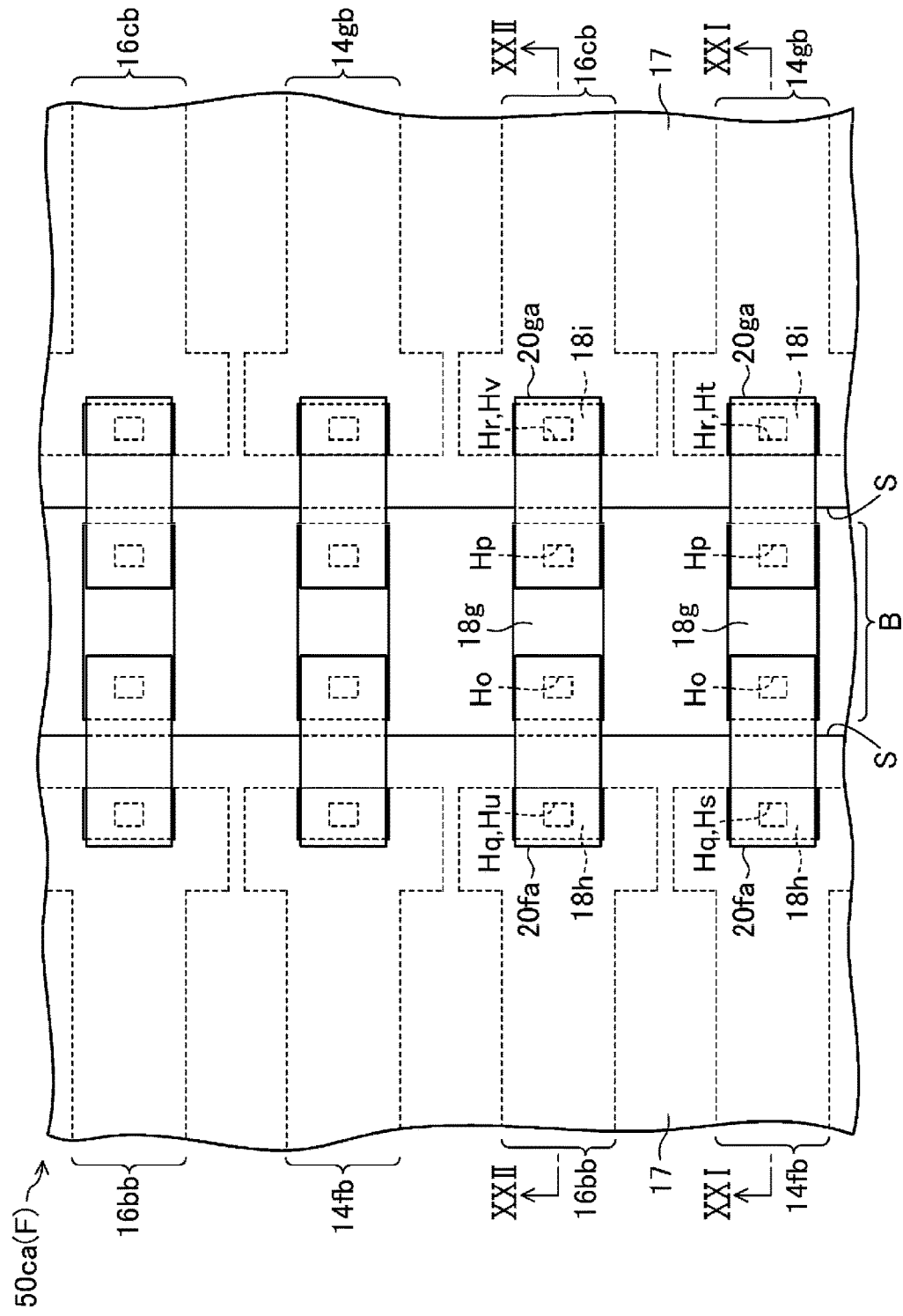
FIG. 20 is a plan view of a frame region including a bending portion of an organic EL display device according to a modification example of the third embodiment of the disclosure, and is a view corresponding to FIG. 6.
Figure 21:
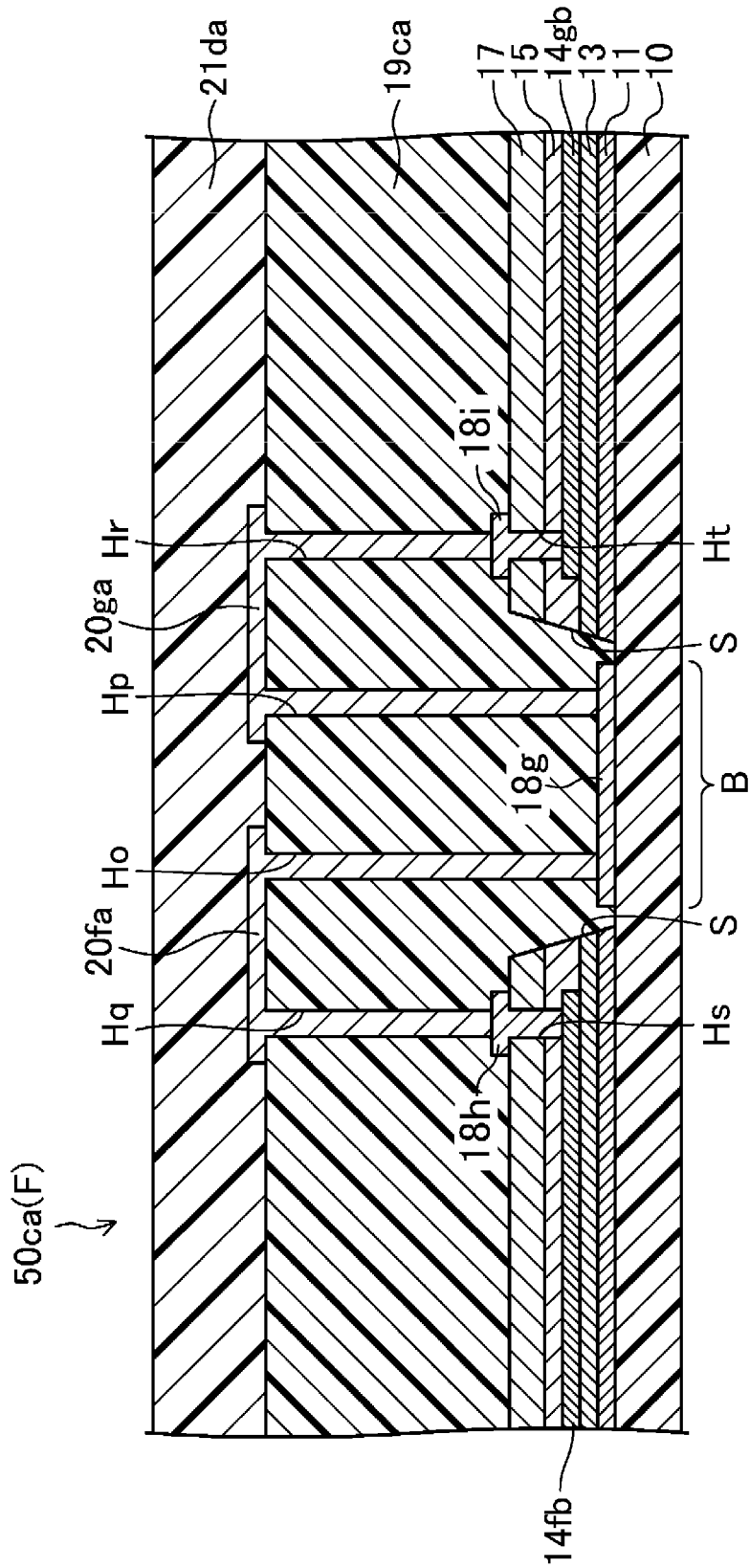
FIG. 21 is a cross-sectional view of the frame region including the bending portion of the organic EL display device taken along line XXI-XXI in FIG. 20.
Figure 22:
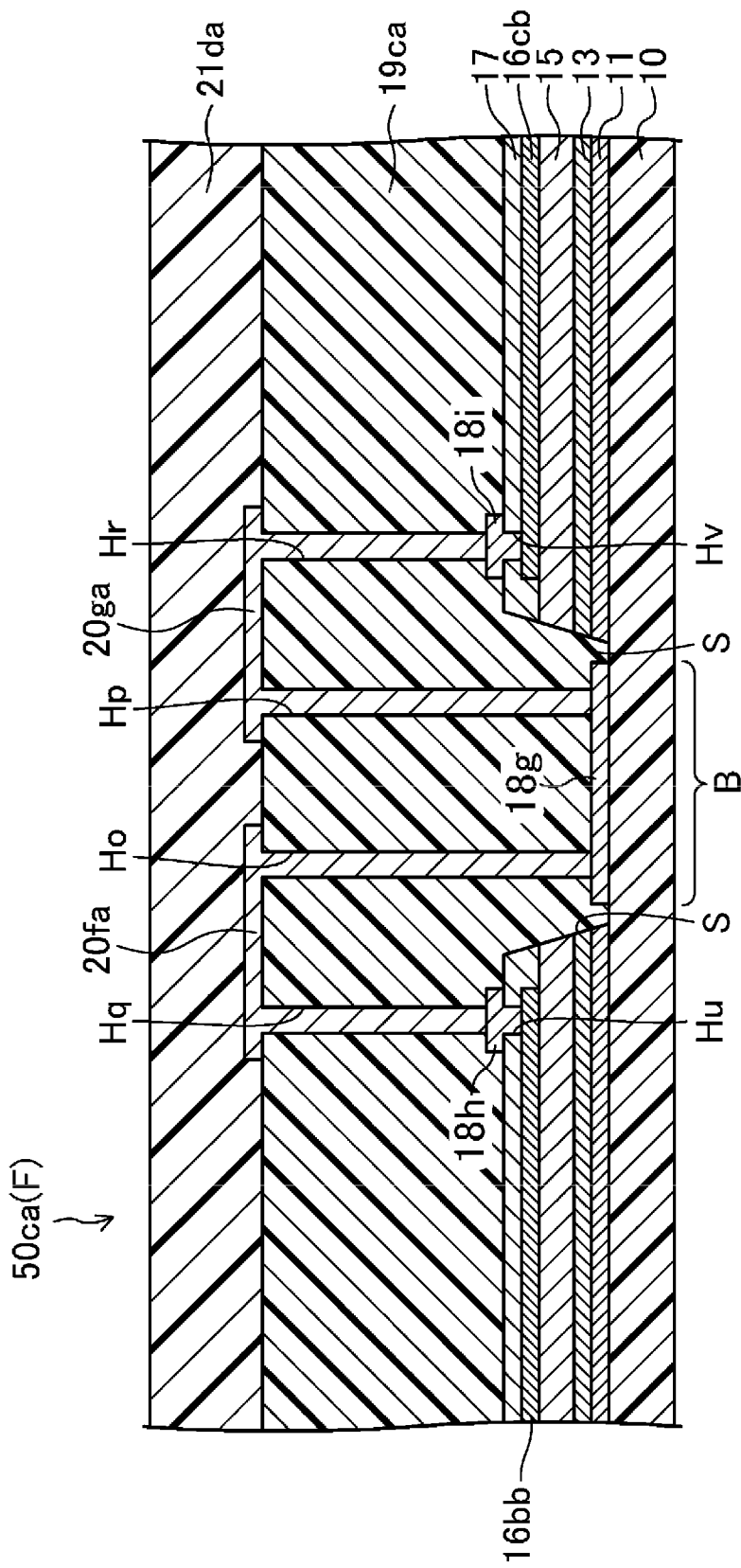
FIG. 22 is a cross-sectional view of the frame region including the bending portion of the organic EL display device taken along line XXII-XXII in FIG. 20.

Note that in the present embodiment, the organic EL display device 50*c* in which the display side first connection wiring line 20*f* and the terminal side first connection wiring line 20*g* extend to the side surface of the first resin film 19*c* is exemplified, but as illustrated in FIG. 20 to FIG. 22, the organic EL display device may be an organic EL display device 50*ca* in which a display side first connection wiring line 20*f* and a terminal side first connection wiring line 20*g* are formed only in an upper face of a first resin film 19*ca*. Here, FIG. 20 is a plan view of a frame region F including a bending portion B of the organic EL display device 50*ca* according to a modification example of the organic EL display device 50*c*, and is a view corresponding to FIG. 6. Additionally, FIG. 21 and FIG. 22 are cross-sectional views of the frame region including the bending portion of the organic EL display device taken along line XXI-XXI and line XXII-XXII in FIG. 20.

Specifically, as illustrated in FIG. 20 to FIG. 22, in the organic EL display device 50*ca*, in the display region D side (left side in the figures) of the upper face of the first resin film 19*ca* corresponding to the first resin film 19*c* of the organic EL display device 50*c*, a plurality of display side first connection wiring lines 20*fa* formed of the third metal film described above are provided extending in parallel to each other in a direction orthogonal to the extending direction of the bending portion B. Additionally, in the organic EL display device 50*ca*, as illustrated in FIG. 20 to FIG. 22, in the terminal portion T side (right side in the figures) of the upper face of the first resin film 19*ca*, a plurality of terminal side first connection wiring lines 20*ga* formed of the third metal film described above are provided extending in parallel to each other in a direction orthogonal to the extending direction of the bending portion B.

Here, as illustrated in FIG. 20 and FIG. 21, the display region D side (left side in the figures) of each of the display side first connection wiring lines 20*fa* is electrically connected to a first lead-out wiring line 14*fb* via a contact hole Hq formed in the first resin film 19*ca*, a first contact layer 18*h*, and a contact hole Hs formed in a second interlayer insulating film 17 and a first interlayer insulating film 15, or as illustrated in FIG. 20 and FIG. 22, the display region D side of the display side first connection wiring line 20*fa* is electrically connected to a third lead-out wiring line 16*bb* via the contact hole Hq formed in the first resin film 19*ca*, the first contact layer 18*h*, and a contact hole Hu formed in the second interlayer insulating film 17. Additionally, as illustrated in FIG. 20 to FIG. 22, the terminal portion T side (right side in the figures) of the display side first connection wiring line 20*fa* is electrically connected to the display region D side (left side in the figures) of a lower layer connection wiring line 18*g* via a contact hole Ho formed in the first resin film 19*ca*. Further, as illustrated in FIG. 20 and FIG. 21, the terminal portion T side (right side in the figures) of each of the terminal side first connection wiring lines 20*ga* is electrically connected to a second lead-out wiring line 14*gb* via a contact hole Hr formed in the first resin film 19*ca*, a second contact layer 18*i*, and a contact hole Ht formed in the second interlayer insulating film 17 and the first interlayer insulating film 15, or as illustrated in FIG. 20 and FIG. 22, the terminal portion T side of the terminal side first connection wiring line 20*ga* is electrically connected to a fourth lead-out wiring line 16*cb* via the contact hole Hr formed in the first resin film 19*ca*, the second contact layer 18*i*, and a contact hole Hv formed in the second interlayer insulating film 17. Additionally, as illustrated in FIG. 20 to FIG. 22, the display region D side (left side in the figures) of the terminal side first connection wiring line 20*ga* is electrically connected to the terminal portion T side (right side in the figures) of the lower layer connection wiring line 18*g* via a contact hole Hp formed in the first resin film 19*ca*. Note that the first contact layer 18*h* and the second contact layer 18*i* are formed of the second metal film described above.

The organic EL display device 50*c* of the present embodiment described above can be manufactured in the method for manufacturing the organic EL display device 50*a* of the first embodiment described above by forming the lower layer connection wiring line 18*g* in forming a source line 18*f* and the like, and modifying a pattern shape of a first connection wiring line 20*c*.

As described above, according to the organic EL display device 50*c* of the present embodiment, the display region D is provided with a plurality of the source lines 18*f* formed of the second metal film, a first flattening film 19*a* covering each of the source lines 18*f*, and a plurality of power source lines 20*a* formed of the third metal film on the first flattening film 19*a*. Additionally, the bending portion B of the frame region F is provided with the first resin film 19*c* filling the slit S formed in a base coat film 11, a gate insulating film 13, the first interlayer insulating film 15 and the second interlayer insulating film 17. Then, the upper face of the first resin film 19c is provided with the plurality of display side first connection wiring lines 20f and the plurality of terminal side first connection wiring lines 20g formed of the third metal film, and the plurality of display side first connection wiring lines 20f and the plurality of terminal side first connection wiring lines 20g extend in parallel to each other in a direction intersecting the extending direction of the bending portion B. Here, the first resin film 19c that fills the slit S is formed of the same material and in the same layer as those of the first flattening film 19a, and it is unnecessary to separately provide a flattening film only to fill the slit S of the bending portion B, and thus disconnection of the display side first connection wiring line 20f and the terminal side first connection wiring line 20g at the bending portion B of the frame region F can be suppressed at a low cost.

Additionally, according to the organic EL display device 50c of the present embodiment, the display region D side of one of the pair of display side first connection wiring lines 20f adjacent of the plurality of display side first connection wiring lines 20f is electrically connected to the first lead-out wiring line 14fb via the contact hole Ha formed in the first interlayer insulating film 15 and the second interlayer insulating film 17, and the terminal portion T side of one of the pair of terminal side first connection wiring lines 20g adjacent of the plurality of terminal side first connection wiring lines 20g is electrically connected to the second lead-out wiring line 14gb via the contact hole Hb formed in the first interlayer insulating film 15 and the second interlayer insulating film 17. Additionally, the display region D side of the other of the pair of display side first connection wiring lines 20f adjacent of the plurality of display side first connection wiring lines 20f is electrically connected to the third lead-out wiring line 16bb via the contact hole He formed in the second interlayer insulating film 17, and the terminal portion T side of the other of the pair of terminal side first connection wiring lines 20g adjacent of the plurality of terminal side first connection wiring lines 20g is electrically connected to the fourth lead-out wiring line 16cb via the contact hole Hd formed in the second interlayer insulating film 17. Here, the first lead-out wiring line 14fb and the second lead-out wiring line 14gb are formed of the first metal film, and the third lead-out wiring line 16bb and the fourth lead-out wiring line 16cb are formed of the fourth metal film, and thus the first interlayer insulating film 15 is interposed between the first lead-out wiring line 14fb and the second lead-out wiring line 14gb, and the third lead-out wiring line 16bb and the fourth lead-out wiring line 16cb. Accordingly, the first lead-out wiring line 14fb and the second lead-out wiring line 14gb, and the third lead-out wiring line 16bb and the fourth lead-out wiring line 16eb can be disposed close to each other, and thus a pitch between adjacent wiring lines in the bending portion B can be narrowed.

OTHER EMBODIMENTS

In each of the embodiments described above, the organic EL layer including a five-layer layered structure including the hole injection layer, the hole transport layer, the light-emitting layer, the electron transport layer, and the electron injection layer is exemplified. However, the organic EL layer may include, for example, a three-layer layered structure including a hole injection-cum-transport layer, a light-emitting layer, and an electron transport-cum-injection layer.

Additionally, in each of the embodiments described above, the organic EL display device including the first electrode as an anode electrode and the second electrode as a cathode electrode is exemplified. However, the disclosure is also applicable to an organic EL display device in which a layered structure of an organic EL layer is inverted, and a first electrode is a cathode electrode and a second electrode is an anode electrode.

Additionally, in each of the embodiments described above, the organic EL display device in which the electrode of the TFT connected to the first electrode is the drain electrode is exemplified. However, the disclosure is also applicable to an organic EL display device in which an electrode of a TFT connected to a first electrode is referred to as a source electrode.

Additionally, in each of the embodiments described above, the organic EL display device is described as an example of a display device. However, the disclosure is also applicable to a display device including a plurality of light-emitting elements driven by a current. For example, the disclosure is applicable to a display device including a quantum-dot light emitting diode (QLED) that is a light-emitting element using a quantum dot-containing layer.

INDUSTRIAL APPLICABILITY

As described above, the disclosure is useful for a flexible display device.

The invention claimed is:
1. A display device comprising:
a resin substrate defining a display region display an image, a frame region in a periphery of the display region, a terminal portion at an end portion of the frame region, and a bending portion extending in one direction between the terminal portion and the display region;
a TFT layer provided on the resin substrate and including a first metal film, a first inorganic insulating film, a second metal film, a first flattening film, a third metal film, and a second flattening film sequentially layered; and
a light-emitting element provided on the TFT layer and including a plurality of pixel electrodes disposed on the second flattening film and an edge cover to cover a peripheral end portion of each of the plurality of pixel electrodes,
wherein the first inorganic insulating film is provided with a slit in the bending portion, and the slit opens upward and extends in an extending direction of the bending portion,
the display region side and the terminal portion side of the slit are provided with a plurality of first lead-out wiring lines and a plurality of second lead-out wiring lines formed of the first metal film, respectively, and the plurality of first lead-out wiring lines and the plurality of second lead-out wiring lines extend in parallel to each other in a direction intersecting the extending direction of the bending portion,
the display region is provided with a plurality of first display wiring lines formed of the second metal film, the first flattening film covering each of the plurality of first display wiring lines, a plurality of second display wiring lines formed of the third metal film on the first flattening film, and the second flattening film covering each of the plurality of second display wiring lines,
the bending portion is provided with a first resin film formed of the same material and in the same layer as those of the first flattening film, and the first resin film fills the slit, an upper face of the first resin film is provided with a plurality of first connection wiring lines formed of the third metal film, and the plurality of first connection wiring lines extend in parallel to each other in a direction intersecting the extending direction of the bending portion, and the plurality of first connection wiring lines are electrically connected to the plurality of first lead-out wiring lines, respectively in the display region side of the slit, and electrically connected to the plurality of second lead-out wiring lines, respectively in the terminal portion side of the slit, wherein a base of the slit is provided with a plurality of lower layer connection wiring lines formed of the second metal film, and the plurality of lower layer connection wiring lines extend in parallel to each other in a direction intersecting the extending direction of the bending portion, and the plurality of first connection wiring lines pass through the plurality of lower layer connection wiring lines, respectively via a contact hole formed in the first resin film.

2. The display device according to claim 1,
wherein the plurality of first connection wiring lines are provided crossing the first resin film and are electrically connected to the plurality of first lead-out wiring lines and the plurality of second lead-out wiring lines, respectively, via a contact hole formed in the first inorganic insulating film.

3. The display device according to claim 1,
wherein in the bending portion, a second resin film formed of the same material and in the same layer as those of the second flattening film is provided on the first resin film and each of the plurality of first connection wiring lines,
the display region side and the terminal portion side of an upper face of the second resin film are provided with a plurality of second connection wiring lines and a plurality of third connection wiring lines formed of the same material and in the same layer as those of each of the plurality of pixel electrodes, respectively, and the plurality of second connection wiring lines and the plurality of third connection wiring lines extend in parallel to each other in a direction intersecting the extending direction of the bending portion,
the plurality of second connection wiring lines extend on a side surface in the display region side of the second resin film and on the first inorganic insulating film, and are electrically connected to the plurality of first lead-out wiring lines, respectively via a contact hole formed in the first inorganic insulating film, and electrically connected to the display region side of the plurality of first connection wiring lines, respectively via a contact hole formed in the second resin film, and
the plurality of third connection wiring lines extend on a side surface in the terminal portion side of the second resin film and on the first inorganic insulating film, and are electrically connected to the plurality of second lead-out wiring lines, respectively via a contact hole formed in the first inorganic insulating film, and electrically connected to the terminal portion side of the plurality of first connection wiring lines, respectively via a contact hole formed in the second resin film.

4. The display device according to claim 3,
wherein at least a side surface of the first resin film is covered by a metal layer formed of the third metal film.

5. The display device according to claim 1,
wherein in the bending portion, a second resin film formed of the same material and in the same layer as those of the second flattening film is provided on the first resin film and each of the plurality of first connection wiring lines,
the display region side and the terminal portion side of an upper face of the second resin film are provided with a plurality of second connection wiring lines and a plurality of third connection wiring lines formed of the same material and in the same layer as those of each of the plurality of pixel electrodes, respectively, and the plurality of second connection wiring lines and the plurality of third connection wiring lines extend in parallel to each other in a direction intersecting the extending direction of the bending portion,
the plurality of second connection wiring lines are electrically connected to the plurality of first lead-out wiring lines, respectively via a contact hole formed in the second resin film and the first inorganic insulating film, and electrically connected to the display region side of the plurality of first connection wiring lines, respectively via a contact hole formed in the second resin film, and
the plurality of third connection wiring lines are electrically connected to the plurality of second lead-out wiring lines, respectively via a contact hole formed in the second resin film and the first inorganic insulating film, and electrically connected to the terminal portion side of the plurality of first connection wiring lines, respectively via a contact hole formed in the second resin film.

6. The display device according to claim 1,
wherein each of the plurality of first connection wiring lines includes a plurality of display side first connection wiring lines provided in the display region side and a plurality of terminal side first connection wiring lines provided in the terminal portion side,
the plurality of display side first connection wiring lines extend on a side surface in the display region side of the first resin film and on the first inorganic insulating film, and are electrically connected to the plurality of first lead-out wiring lines, respectively via a contact hole formed in the first inorganic insulating film, and electrically connected to the display region side of the plurality of lower layer connection wiring lines, respectively via a contact hole formed in the first resin film, and
the plurality of terminal side first connection wiring lines extend on a side surface in the terminal portion side of the first resin film and on the first inorganic insulating film, and are electrically connected to the plurality of second lead-out wiring lines, respectively via a contact hole formed in the first inorganic insulating film, and electrically connected to the terminal portion side of the plurality of lower layer connection wiring lines, respectively via a contact hole formed in the first resin film.

7. The display device according to claim 1,
wherein each of the plurality of first connection wiring lines includes a plurality of display side first connection wiring lines provided in the display region side and a plurality of terminal side first connection wiring lines provided in the terminal portion side,
a plurality of first contact layers formed of the second metal film are provided on the first inorganic insulating film at an edge portion in the display region side of the slit, and the plurality of first contact layers are electrically connected to the plurality of first lead-out wiring lines, respectively via a contact hole formed in the first inorganic insulating film, a plurality of second contact layers formed of the second metal film are provided on the first inorganic insulating film at an edge portion in the terminal portion side of the slit, and the plurality of second contact layers are electrically connected to the plurality of second lead-out wiring lines, respectively via a contact hole formed in the first inorganic insulating film, the plurality of display side first connection wiring lines are electrically connected to the plurality of first contact layers, respectively via a contact hole formed in the first resin film, and electrically connected to the display region side of the plurality of lower layer connection wiring lines, respectively via another contact hole formed in the first resin film, and the plurality of terminal side first connection wiring lines are electrically connected to the plurality of second contact layers, respectively via a contact hole formed in the first resin film, and electrically connected to the terminal portion side of the plurality of lower layer connection wiring lines, respectively via another contact hole formed in the first resin film.

8. The display device according to claim 1, wherein the TFT layer includes a fourth metal film and a second inorganic insulating film sequentially provided from the first inorganic insulating film side between the first inorganic insulating film and the second metal film, the display region side and the terminal portion side of the slit are provided with a plurality of third lead-out wiring lines and a plurality of fourth lead-out wiring lines formed of the fourth metal film, respectively, and the plurality of third lead-out wiring lines and the plurality of fourth lead-out wiring lines extend in parallel to each other in a direction intersecting the extending direction of the bending portion, and one of a pair of first connection wiring lines adjacent of the plurality of first connection wiring lines is electrically connected to a corresponding first lead-out wiring line of the plurality of first lead-out wiring lines and a corresponding second lead-out wiring line of the plurality of second lead-out wiring lines, via a contact hole formed in the first inorganic insulating film and the second inorganic insulating film, and the other of the pair of first connection wiring lines adjacent is electrically connected to a corresponding third lead-out wiring line of the plurality of third lead-out wiring lines and a corresponding fourth lead-out wiring line of the plurality of fourth lead-out wiring lines, via a contact hole formed in the second inorganic insulating film.

9. The display device according to claim 1, wherein the display region is provided with a plurality of display wiring lines, the terminal portion is provided with a plurality of terminals, the plurality of first lead-out wiring lines are electrically connected to the plurality of display wiring lines, respectively and the plurality of second lead-out wiring lines are electrically connected to the plurality of terminals, respectively.

10. The display device according to claim 9, wherein the display region is provided with a plurality of gate lines formed of the first metal film, as the plurality of display wiring lines.

11. The display device according to claim 9, wherein the display region is provided with a plurality of source lines formed of the second metal film, as the plurality of display wiring lines.

12. The display device according to claim 9, wherein the display region is provided with a plurality of power source lines formed of the third metal film, as the plurality of display wiring lines.

13. The display device according to claim 1, wherein the light-emitting element is an organic EL element.

\* \* \* \* \*